US011190151B2

(12) United States Patent
Kondo et al.

(10) Patent No.: US 11,190,151 B2
(45) Date of Patent: Nov. 30, 2021

(54) POWER AMPLIFIER

(71) Applicant: Murata Manufacturing Co., Ltd., Kyoto-fu (JP)

(72) Inventors: Masao Kondo, Nagaokakyo (JP); Yuichi Saito, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 56 days.

(21) Appl. No.: 16/586,068

(22) Filed: Sep. 27, 2019

(65) Prior Publication Data
US 2020/0106404 A1    Apr. 2, 2020

(30) Foreign Application Priority Data

Sep. 28, 2018   (JP) .............................. JP2018-184020

(51) Int. Cl.
*H03F 3/68*     (2006.01)
*H03F 3/04*     (2006.01)
(Continued)

(52) U.S. Cl.
CPC .............. *H03F 3/193* (2013.01); *H03F 1/30* (2013.01); *H03F 1/0017* (2013.01); *H03F 2200/451* (2013.01)

(58) Field of Classification Search
CPC ...... H03F 3/193; H03F 1/30; H03F 2200/451; H03F 2200/366; H03F 3/195;
(Continued)

(56) References Cited

U.S. PATENT DOCUMENTS 9,634,619 B2    4/2017   Gerard et al.
9,813,027 B2   11/2017   Quaglietta et al.
(Continued)

FOREIGN PATENT DOCUMENTS

JP   2002-280842 A   9/2002
JP    2004-80356 A   3/2004
(Continued)

OTHER PUBLICATIONS

An Office Action mailed by Taiwan Intellectual Property Office dated Jun. 29, 2020, which corresponds to Taiwanese Patent Application No. 108127713 and is related to U.S. Appl. No. 16/586,068.

*Primary Examiner* — Khanh V Nguyen
(74) *Attorney, Agent, or Firm* — Studebaker & Brackett PC

(57) ABSTRACT

A power amplifier including a first transistor for amplifying and outputting a radio frequency signal, a second transistor, a third transistor for supplying a bias current, a first voltage supply circuit for supplying a lower voltage to a base of the third transistor as a temperature of a first diode is higher. The third transistor and the first transistor, or the third transistor and the second transistor, are disposed without another electronic element interposed therebetween. The third transistor is disposed such that a distance between the third transistor and the first transistor is smaller than a distance between the first voltage supply circuit and the first transistor, or a distance between the third transistor and the second transistor is smaller than a distance between the first voltage supply circuit and the second transistor.

20 Claims, 22 Drawing Sheets

(51) Int. Cl.
    *H03F 3/193*     (2006.01)
    *H03F 1/30*     (2006.01)
    *H03G 1/00*     (2006.01)

(58) Field of Classification Search
    CPC .......... H03F 3/211; H03F 3/245; H03F 1/302; H03F 3/19; H03F 1/26; H03F 2200/447; H03F 2200/18; H03F 1/301; H03G 1/0017; H03G 3/3042
    USPC ........................................ 330/289, 296, 310
    See application file for complete search history.

(56) References Cited

U.S. PATENT DOCUMENTS

| | | | |
|---|---|---|---|
| 9,917,549 B1 | 3/2018 | Allen | |
| 10,128,797 B2 * | 11/2018 | Sasaki | H03F 3/213 |
| 10,291,182 B2 * | 5/2019 | Ishihara | H03F 1/56 |
| 2003/0186509 A1 * | 10/2003 | Mochizuki | H03F 1/302 |
| | | | 438/312 |
| 2018/0026582 A1 | 1/2018 | Sasaki | |
| 2018/0241349 A1 | 8/2018 | Ishihara et al. | |
| 2018/0342992 A1 * | 11/2018 | Sato | H03F 3/213 |

FOREIGN PATENT DOCUMENTS

| | | |
|---|---|---|
| JP | 4074260 B2 | 4/2008 |
| JP | 2009-253728 A | 10/2009 |
| JP | 2011-101405 A | 5/2011 |
| JP | 5939404 B2 | 6/2016 |
| TW | 201729398 A | 8/2017 |
| TW | 201834387 A | 9/2018 |

\* cited by examiner

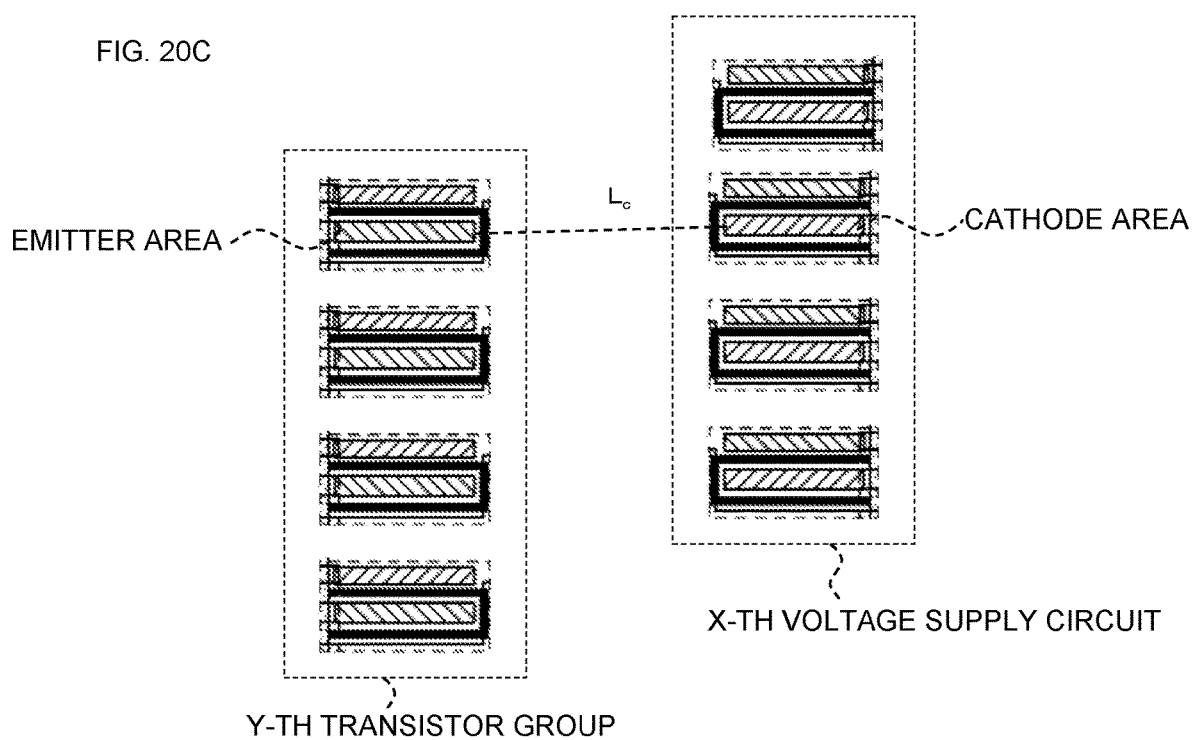

POWER AMPLIFIER

CROSS-REFERENCE TO RELATED APPLICATION

This application claims benefit of priority to Japanese Patent Application No. 2018-184020, filed Sep. 28, 2018, the entire content of which is incorporated herein by reference.

BACKGROUND

Technical Field

The present disclosure relates to a power amplifier.

Background Art

In a mobile communication device such as a mobile phone, a power amplifier circuit is used to amplify power of a radio frequency (RF) signal to be transmitted to a base station.

For example, U.S. Patent Application Publication No. 2018/26582 describes a power amplifier circuit including a driver stage amplifier and a bias circuit for supplying a bias current to the driver stage amplifier. The bias circuit includes an emitter-follower circuit transistor for supplying a bias current to the driver stage amplifier, and a voltage supply circuit having two diodes connected in series between a power source and the ground and thermally coupled to the driver stage amplifier.

The two diodes that the voltage supply circuit has supply a voltage corresponding to respective temperatures of the two diodes to a base of the emitter-follower circuit transistor. Thus, when an ambient temperature or a temperature of the driver stage amplifier increases, the voltage applied to the base of the emitter-follower circuit transistor by the two diodes decreases. Then, the bias current supplied to the driver stage amplifier by the emitter-follower circuit transistor decreases. In this manner, the power amplifier circuit has a temperature compensation function for reducing temperature change in the ambient temperature and in the driver stage amplifier.

Incidentally, for example, there has been known a technique of controlling magnitude of a power supply voltage in accordance with magnitude of output of a power amplifier, such as envelope tracking control. In order to perform normal envelope tracking control, a gain needs to increase as a power supply voltage increases at high output power. However, in general, when a power supply voltage increases, power-added efficiency decreases and a loss increases, so that a temperature increase in an amplifying stage transistor due to self-heating increases. Then, when the temperature of the amplifying stage transistor excessively increases, a gain of an amplifying stage decreases. Because of this, in the prior art, there has been a problem that a gain becomes equal to or less than that in a case of a lower power supply voltage when the power supply voltage is high.

When the temperature of the amplifying stage transistor increases due to self-heating at high output, a circuit having the temperature compensation function described above suppresses an increase in collector current of the amplifying stage transistor with the temperature increase. When the increase in the collector current is suppressed, the decrease in the gain with the temperature increase in the amplifying stage transistor becomes more remarkable, and thus the gain further decreases. Further, there has been a problem that, when the circuit having the temperature compensation function described above is disposed close to the amplifying stage transistor, the collector current suppressing effect is enhanced, so that the decrease in gain tends to further increase.

SUMMARY

Accordingly, the present disclosure provides a power amplifier capable of reducing a decrease in gain with an increase in power of an output signal.

A power amplifier according to an aspect of the present disclosure includes a first transistor group including a plurality of unit transistors connected in parallel for amplifying and outputting a radio frequency signal, a second transistor group including a plurality of unit transistors connected in parallel for amplifying and outputting an output signal from the first transistor group, a third transistor for supplying a bias current to a base of the first transistor group, and a first voltage supply circuit including at least one of a first diode and an eleventh transistor, for supplying a lower voltage to a base of the third transistor as a temperature of the first diode or the eleventh transistor is higher. The third transistor and the first transistor group are disposed without another electronic element interposed therebetween or the third transistor and the second transistor group are disposed without another electronic element interposed therebetween, and the third transistor is disposed such that a minimum distance between the third transistor and the first transistor group is smaller than a minimum distance between the first voltage supply circuit and the first transistor group, or a minimum distance between the third transistor and the second transistor group is smaller than a minimum distance between the first voltage supply circuit and the second transistor group.

According to this aspect, the third transistor can be thermally coupled to the first transistor group or the second transistor group strongly compared to the first voltage supply circuit, so that it is possible to reduce a decrease in gain with an increase in output.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 20C is a diagram illustrating an exemplification of a minimum distance between an X-th voltage supply circuit and a Y-th transistor group.

DETAILED DESCRIPTION

Figure 1:
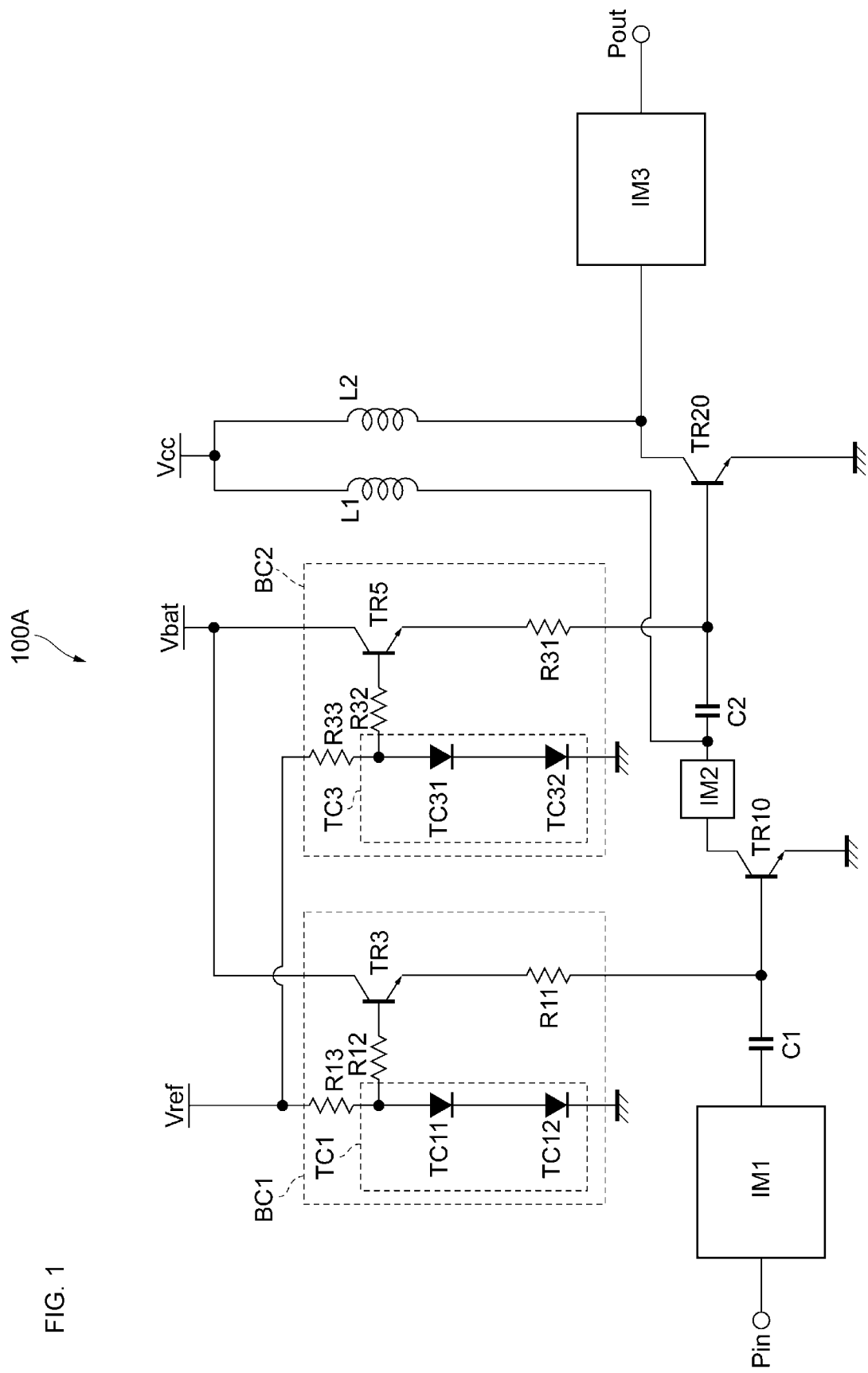
FIG. 1 is a diagram illustrating an outline of a configuration of a power amplifier according to a first embodiment.

Hereinafter, embodiments of the present disclosure will be described in detail with reference to the accompanying drawings. Note that, the same element is assigned the same reference character, and a description thereof will be omitted.

First Embodiment

1. Circuit Configuration
1-1. Overall

FIG. 1 is a diagram illustrating an outline of a configuration of a power amplifier 100A according to a first embodiment. The power amplifier 100A illustrated in FIG. 1 is, for example, a circuit that is mounted on a mobile communication device such as a mobile phone, and amplifies power of a radio frequency (RF) signal to a level necessary to be transmitted to a base station. The power amplifier 100A amplifies transmission signals compliant with communication standards such as, for example, 2G (second generation mobile communication system), 3G (third generation mobile communication system), 4G (fourth generation mobile communication system), 5G (fifth generation mobile communication system), LTE (Long Term Evolution)-FDD (Frequency Division Duplex), LTE-TDD (Time Division Duplex), LTE-Advanced, or LTE-Advanced Pro. A frequency of an RF signal ranges from, for example, about several hundred MHz to several ten GHz. Note that, communication standards and frequencies of signals amplified by the power amplifier 100A are not limited to the above.

Specifically, the power amplifier 100A includes, for example, transistor groups TR10, TR20, bias circuits BC1, BC2, matching circuits IM1, IM2, IM3, inductors L1, L2, capacitors C1, and C2.

1-2. Transistor Groups TR10 and TR20

Each of the transistor groups TR10 and TR20 amplifies and outputs an inputted RF signal. Specifically, in the transistor group TR10 (a first transistor group), a plurality of unit transistors is connected in parallel to form an amplifier of a first stage (driver stage), and amplifies and outputs an RF signal inputted from an input terminal via the matching circuit IM1. Also, in the transistor group TR20 (a second transistor group), a plurality of unit transistors is connected in parallel to form an amplifier of a subsequent stage (power stage), and amplifies and outputs an RF signal supplied from the transistor group TR10. Each of the transistor groups TR10 and TR20 is constituted by, for example, parallel connection of a plurality of bipolar transistors such as a heterojunction bipolar transistor (HBT) of a compound semiconductor formed of GaAs or the like.

In the transistor group TR10, a power supply voltage Vcc is supplied to a collector via the inductor L1, an RF signal and a bias current supplied from the transistor TR3 to be described later are supplied to a base, and an emitter is grounded. Thus, the transistor group TR10 amplifies the RF signal and outputs the amplified RF signal from the collector. In FIG. 1, the transistor group TR10 is described as one transistor, but a plurality of unit transistors is connected in parallel to function as the one transistor.

In the transistor group TR20, the power supply voltage Vcc is supplied to a collector via the inductor L2, an RF signal supplied from the transistor group TR10 and a bias current supplied from a transistor TR5 to be described later are supplied to a base, and an emitter is grounded. Thus, the transistor group TR20 amplifies the RF signal supplied from the transistor group TR10, and outputs the amplified RF signal from the collector. In FIG. 1, the transistor group TR20 is described as one transistor, but a plurality of unit transistors is connected in parallel to function as the one transistor.

1-3. Bias Circuit
1-3-1. Bias Circuit BC1

The bias circuit BC1 supplies a bias current to the base of the transistor group TR10 that is the amplifier of the first stage (driver stage). The bias circuit BC1 includes, for example, the transistor TR3, a voltage supply circuit TC1 (a first voltage supply circuit), and resistance elements R11, R12, and R13. The voltage supply circuit TC1 includes, for example, a diode TC11 (a first diode) and a TC12 (a first diode).

In the transistor TR3 (a third transistor), a voltage Vbat is supplied to a collector, a base is connected to an anode of the diode TC11 via the resistance element R12, and an emitter is connected to the base of the transistor group TR10 via the resistance element R11. The transistor TR3 supplies a bias current to the base of the transistor group TR10 from the emitter. A transistor having the above function is also commonly referred to as an emitter-follower transistor.

In the diode TC11, the anode is supplied with a bias control voltage Vref via the resistance element R13, and a cathode is connected to an anode of the diode TC12. In the diode TC12, the anode is connected to the cathode of the diode TC11, and a cathode is grounded. Thus, a voltage at a predetermined level (for example, about 2.6 V) is generated at the anode of the diode TC11.

In the resistance element R11, one end is connected to the emitter of the transistor TR3, and another end is connected to the base of the transistor group TR10. In the resistance element R12, one end is connected to the base of the transistor TR3, and another end is connected to the anode of the diode TC11. In the resistance element R13, one end is supplied with the bias control voltage Vref, and another end is connected to the anode of the diode TC11.

Note that, capacitance for stabilizing voltage may be disposed between each node in the bias circuit BC1 and the ground, and between the nodes, but the capacitance is omitted in this figure. When respective temperatures of the diodes TC11 and TC12 increase, currents flowing from the voltage Vref to the diodes increase, a voltage drop by the resistance element R13 increases, and base potential of the transistor TR3 decreases. This suppresses a collector current increase in TR3 due to the temperature increase. Thus, the voltage supply circuit TC1 is commonly also referred to as a temperature compensation circuit.

1-3-2. Bias Circuit BC2

The bias circuit BC2 supplies a bias current to the base of the transistor group TR20 that is the amplifier of the subsequent stage (power stage). The bias circuit BC2 includes, for example, the transistor TR5, a voltage supply circuit TC3 (a third voltage supply circuit), and resistance elements R31, R32, and R33. The voltage supply circuit TC3 includes, for example, diodes TC31 (a third diode) and TC32 (a third diode).

In the transistor TR5 (a fifth transistor), the voltage Vbat is supplied to a collector, a base is connected to an anode of the diode TC31 via the resistance element R32, and an emitter is connected to the base of the transistor group TR20 via the resistance element R31. The transistor TR5 supplies a bias current to the base of the transistor group TR20 from the emitter.

In the diode TC31, the anode is supplied with the bias control voltage Vref via the resistance element R33, and a cathode is connected to an anode of the diode TC32. In the diode TC32, the anode is connected to the cathode of the diode TC31, and a cathode is grounded. Thus, a voltage at a predetermined level (for example, about 2.6 V) is generated at a collector of the diode TC31.

In the resistance element R31, one end is connected to the emitter of the transistor TR5, and another end is connected to the base of the transistor group TR20. In the resistance element R32, one end is connected to the base of the transistor TR5, and another end is connected to the anode of the diode TC31. In the resistance element R33, one end is supplied with the bias control voltage Vref, and another end is connected to the anode of the diode TC31.

Note that, capacitance for stabilizing voltage may be disposed between each node in the bias circuit BC2 and the ground, and between the nodes, but the capacitance is omitted in this figure. When respective temperatures of the diodes TC31 and TC32 increase, currents flowing from the voltage Vref to the diodes increase, a voltage drop by the resistance element R33 increases, and base potential of the transistor TR5 decreases.

1-4. Other Configurations

One end of the inductor L1 is supplied with the power supply voltage Vcc and another end thereof is connected to the collector of the transistor group TR10, and one end of the inductor L2 is supplied with the power supply voltage Vcc and another end thereof is connected to the collector of the transistor group TR20. Each of the inductors L1 and L2 is a choke inductor for suppressing leakage of an AC component to a side of the power supply voltage Vcc.

The matching circuit IM1 matches impedance between a circuit (not illustrated) provided at a preceding stage and the transistor group TR10. The matching circuit IM2 matches impedance between the transistor group TR10 and the transistor group TR20. The matching circuit IM2 matches impedance between the transistor group TR20 and a circuit (not illustrated) provided at a subsequent stage.

The capacitor C1 is provided on an input side of the transistor groups TR10, and the capacitor C2 is provided on an input side of the transistor TR20. Each of the capacitors C1 and C2 is a coupling capacitor that blocks a DC component included in an RF signal and passes through an AC component.

2. Positional Relationship Among Units

Next, with reference to FIGS. 2 to 4, a description will be given of a positional relationship among respective units included in the power amplifier 100A according to the first embodiment.

Figure 2:
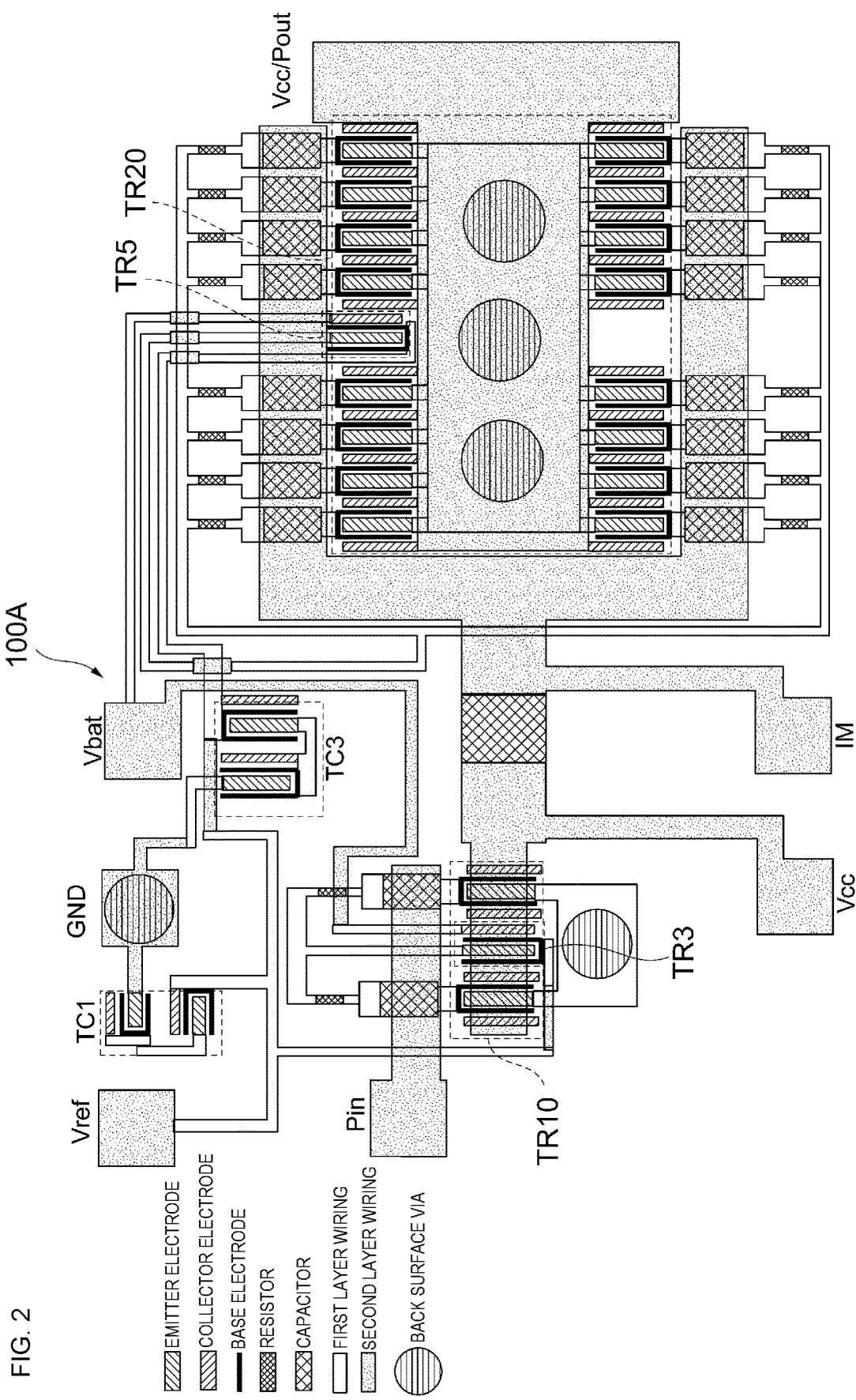
FIG. 2 is a diagram illustrating an example of a layout of the power amplifier according to the first embodiment.

FIG. 2 is a diagram illustrating an example of a layout of the power amplifier 100A according to the first embodiment. Note that, the diagram illustrated in FIG. 2 is a schematic diagram, and does not illustrate an entire configuration of the power amplifier 100A. Further, FIG. 3 is a diagram schematically illustrating planar arrangement of each block constituting the power amplifier 100A according to the first embodiment. Note that, the diagram illustrated in FIG. 3 is a schematic diagram, and does not accurately illustrate arrangement of the respective units of the power amplifier 100A.

Each of the transistor groups TR10 and TR20 is constituted by the plurality of unit transistors. Here, the unit transistor refers to minimum structure constituting a transistor. In FIG. 3, a substantially rectangular block denoted as "TR1" is a unit transistor constituting the transistor group TR10, and a substantially rectangular block denoted as "TR2" is a unit transistor constituting the transistor group TR20.

Figure 3:
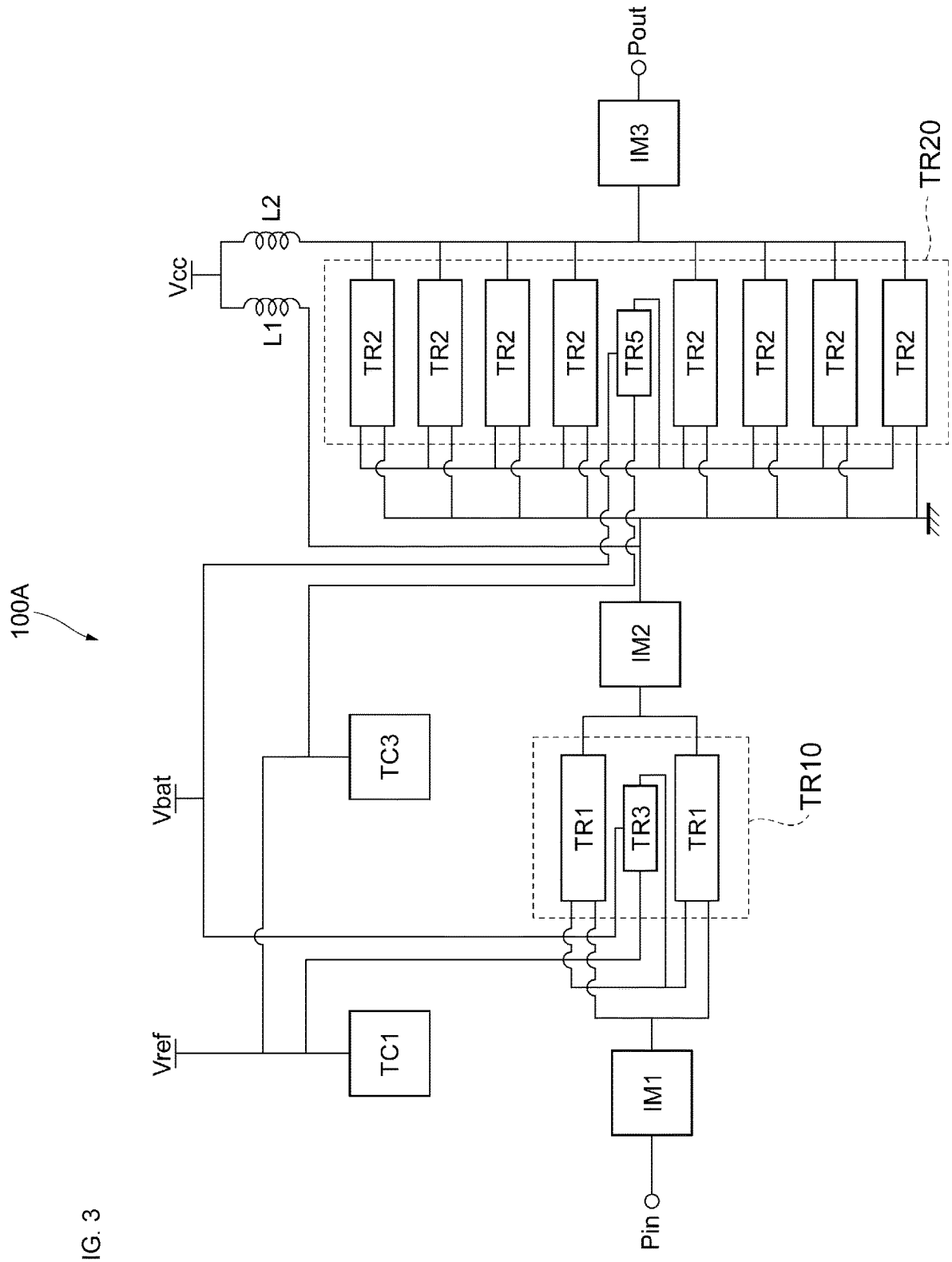
FIG. 3 is a diagram schematically illustrating planar arrangement of each block constituting the power amplifier according to the first embodiment.

As illustrated in FIGS. 2 and 3, the transistor TR3 and the transistor group TR10 are disposed without other electronic elements interposed therebetween. More specifically, the transistor TR3 is disposed among the transistor group TR10 (between two of a plurality of the unit transistors TR1 constituting the transistor group TR10 in a plan view). Further, a minimum distance between the transistor TR3 and the transistor group TR10 is smaller than a minimum distance between the voltage supply circuit TC1 and the transistor group TR10.

Additionally, as illustrated in FIGS. 2 and 3, the transistor TR5 and the transistor group TR20 are disposed without other electronic elements interposed therebetween. More specifically, the transistor TR5 is disposed among the transistor group TR20 (between two of a plurality of the unit transistors TR2 constituting the transistor group TR20 in a plan view). Further, a minimum distance between the transistor TR5 and the transistor group TR20 is smaller than a minimum distance between the voltage supply circuit TC3 and the transistor group TR20.

Here, a specific example of "disposed without . . . interposed therebetween" will be described. Hereinafter, a description will be given of "disposing without . . . interposed therebetween" taking a case of the transistor group TR10 and the transistor TR3 as an example, but a similar description will be applied to a case where the transistor group TR10 and the transistor TR3 are replaced by other elements.

Figure 4A:
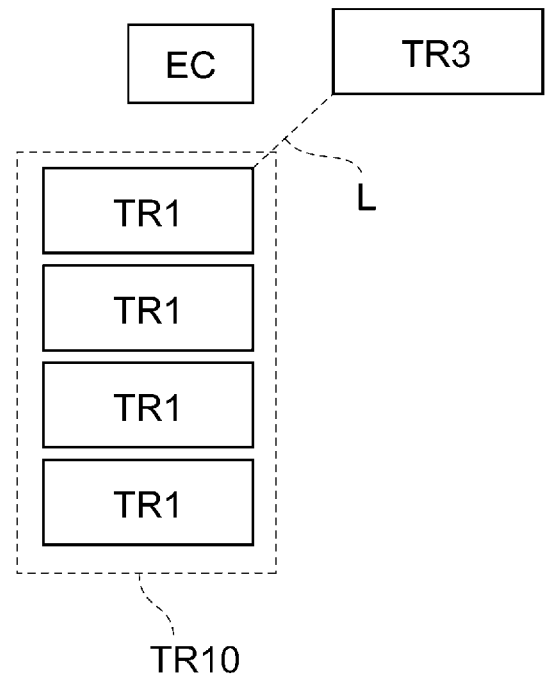
FIG. 4A is a diagram illustrating an example when a transistor and a transistor group are disposed without other electronic elements interposed therebetween.

FIG. 4A is a diagram illustrating an example when the transistor TR3 and the transistor group TR10 are disposed without other electronic elements interposed therebetween. A dotted line in FIG. 4A represents a line L connecting the transistor group TR10 and the transistor TR3 with each other at a minimum distance (hereinafter, referred to as a "shortest line L").

As illustrated in FIG. 4A, another electronic element EC is not in contact with the shortest line L. At this time, it can be said that the transistor TR3 and the transistor group TR10 are disposed without other electronic elements interposed therebetween. Conversely, when the other electronic element EC is in contact with the shortest line L, regardless of the degree, it can be said that the transistor TR3 and the transistor group TR10 are not disposed without other electronic elements interposed therebetween.

Figure 4B:
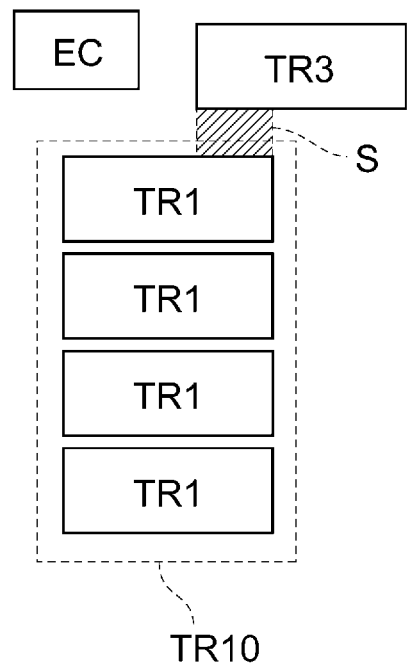
FIG. 4B is a diagram illustrating another example when the transistor and the transistor group are disposed without other electronic elements interposed therebetween.

FIG. 4B is a diagram illustrating another example when the transistor TR3 and the transistor group TR10 are disposed without other electronic elements interposed therebetween. The above FIG. 4A is an example in which the shortest line L is determined to be substantially one straight line in accordance with a positional relationship between the transistor group TR10 and the transistor TR3. On the other hand, FIG. 4B is an example in which the shortest line L is not determined to substantially one straight line in accordance with the positional relationship between the transistor group TR10 and the transistor TR3, and a set of the shortest lines L constitutes a certain surface (hereinafter referred to as a "shortest surface S").

A hatched substantially rectangular area surrounded by a dotted line in FIG. 4B represents the shortest surface S constituted by the set of shortest lines L. As illustrated in FIG. 4B, the other electronic element EC is not in contact with the shortest surface S. At this time, it can be said that the transistor TR3 and the transistor group TR10 are disposed without other electronic elements interposed therebetween. Conversely, when the other electronic element EC is in contact with the shortest surface S, regardless of the degree, it can be said that the transistor TR3 and the transistor group TR10 are not disposed without other electronic elements interposed therebetween.

As a voltage supply circuit (temperature compensation circuit), forms illustrated in FIG. 19A, FIG. 19B, FIG. 19C, FIG. 19D and the like are known in addition to the form of the voltage supply circuit TC1 described above, and these can also be used instead of the voltage supply circuits TC1 and TC3. In FIG. 19A to FIG. 19D, it is also possible to dispose capacitance for stabilizing voltage between each node in the circuit and the ground, and between the nodes, but the capacitance is omitted. Further, it is also possible to dispose a resistor for adjusting voltage change between each node and the ground and between the nodes, but the resistor is omitted except for a case where it is required.

Figure 19A:
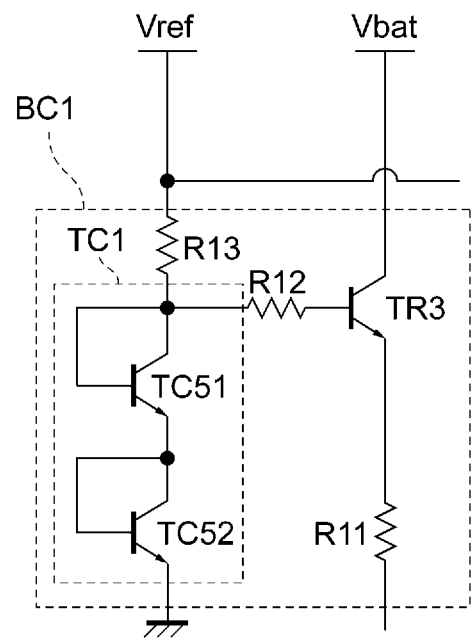
FIG. 19A is a diagram illustrating an outline of a circuit in a form different from that illustrated in FIG. 1 with respect to a voltage supply circuit (temperature compensation circuit) according to the first and the second embodiments.

The voltage supply circuit (temperature compensation circuit) illustrated in FIG. 19A includes transistors TC51 and TC52 (eleventh transistors) instead of the diodes TC11 and TC12 included in the voltage supply circuit TC1 described above. The transistors TC51 and TC52 are configured such that a collector and a base are connected, and are diode-connected.

Figure 19B:
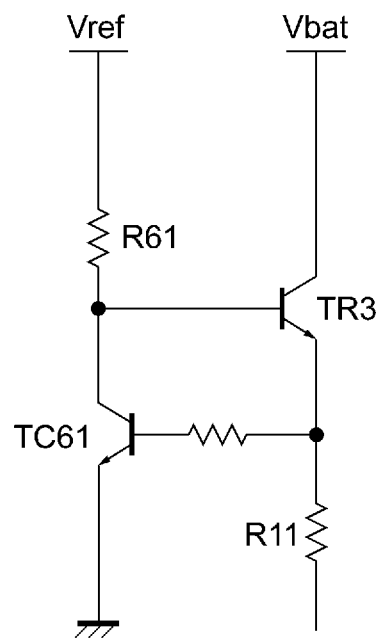
FIG. 19B is a diagram illustrating an outline of a circuit in a form different from that illustrated in FIG. 1 with respect to the voltage supply circuit (temperature compensation circuit) according to the first and the second embodiments.
Figure 19C:
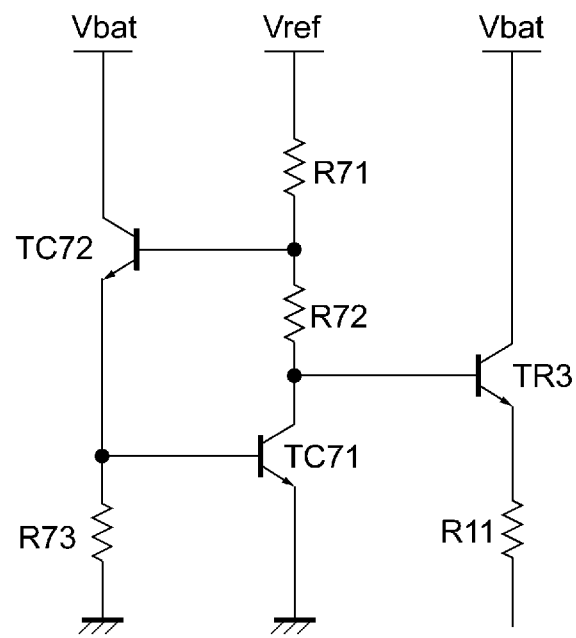
FIG. 19C is a diagram illustrating an outline of a circuit in a form different from that illustrated in FIG. 1 with respect to the voltage supply circuit (temperature compensation circuit) according to the first and the second embodiments.

In the respective voltage supply circuits (temperature compensation circuits) illustrated in FIG. 19B and FIG. 19C, when a temperature of a transistor TC61 or TC71 increases due to self-heating of an amplifying stage, a current flowing from the voltage Vref to the transistor TC61 or TC71 increases, a voltage drop due to a resistance element R61 or resistance elements R71 and R72 increases, so that base potential of the emitter-follower transistor TR3 decreases.

Figure 19D:
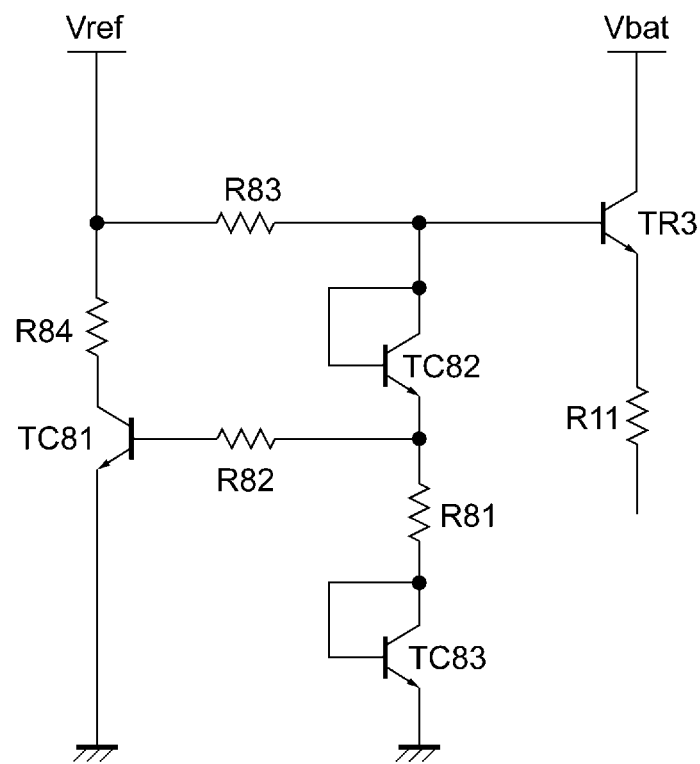
FIG. 19D is a diagram illustrating an outline of a circuit in a form different from that illustrated in FIG. 1 with respect to the voltage supply circuit (temperature compensation circuit) according to the first and the second embodiments.

In the voltage supply circuit (temperature compensation circuit) illustrated in FIG. 19D, when a temperature of a transistor TC81 increases due to self-heating of an amplifier stage, base potential of a transistor TC83 decreases, thereby decreasing potential of an anode and a cathode of a diode connected to a base of the emitter-follower transistor TR3, so that base potential of the emitter-follower transistor TR3 decreases.

The voltage supply circuit (temperature compensation circuit) is not limited to the above, and a voltage supply circuit may be applied as long as a voltage applied to a base of an emitter-follower transistor decreases due to a temperature increase.

3. Effect

Effects of the power amplifier 100A according to the first embodiment will be described with reference to FIGS. 5 and 6.

Figure 5:
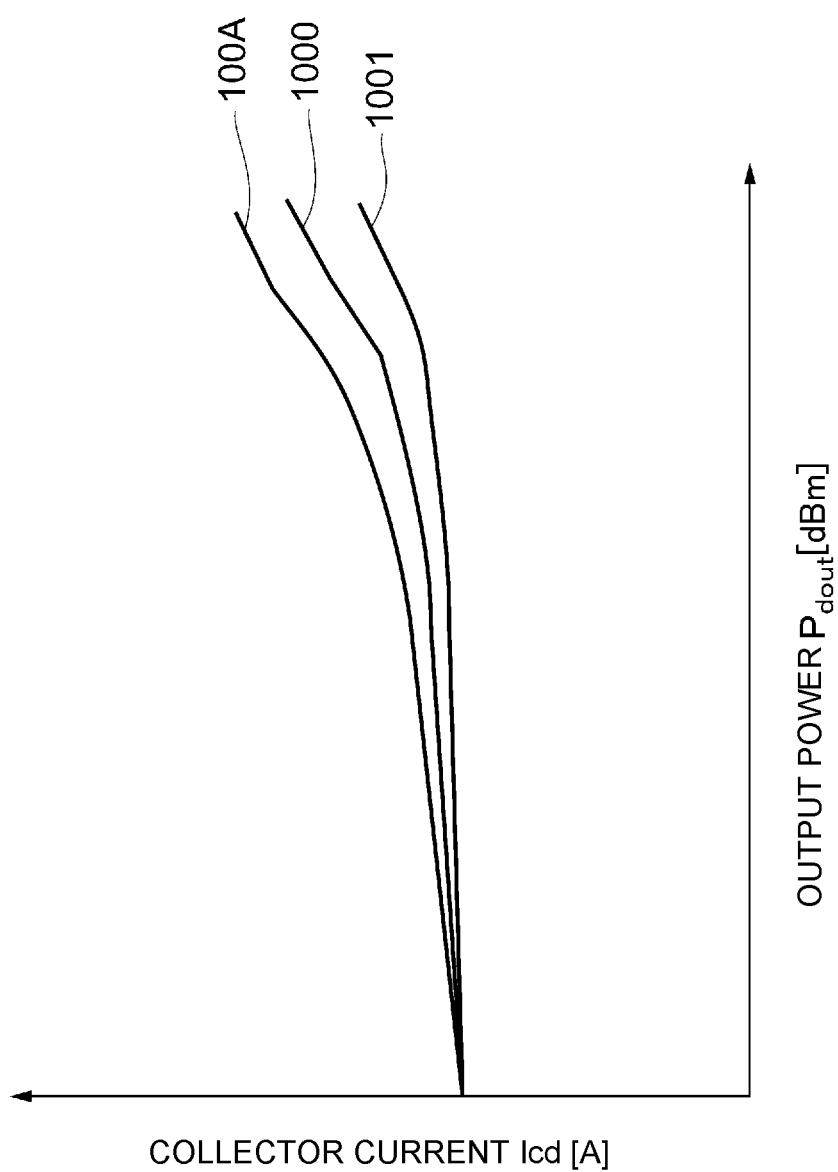
FIG. 5 is a diagram illustrating a relationship between output power Pdout (dBm) of a driver stage amplifier and a collector current Icd (A)

FIG. 5 is a diagram illustrating a relationship between the output power Pdout (dBm) of a driver stage and the collector current Icd (A). In FIG. 5, a reference character 100A denotes the power amplifier 100A according to the first embodiment, a reference character 1000 denotes a power amplifier 1000 in which a driver stage and a bias circuit are not thermally coupled, and a reference character 1001 denotes a power amplifier 1001 in which a driver stage and a voltage supply circuit (temperature compensation circuit) of a bias circuit are thermally coupled.

As the output power Pdout of a driver stage increases, the collector current Icd of the driver stage increases. This is caused by two factors, that is, an increase in bias voltage due to expansion of collector voltage amplitude, and a temperature increase in the driver stage and in an emitter-follower transistor of the bias circuit due to self-heating, and the like.

In a case of the power amplifier 1001, since a temperature compensation circuit diode of a bias circuit and a driver stage are thermally coupled to each other, an effect of suppressing a bias circuit current of the temperature compensation circuit, that is, the driver stage collector current Icd is enhanced. Thus, compared to the power amplifier 1000 in which the bias circuit and the driver stage are not thermally coupled to each other, an increase in the collector current Icd with an increase in the output power Pdout decreases.

On the other hand, in the power amplifier 100A according to the first embodiment, as described above, the emitter-follower transistor TR3 of the driver stage bias circuit and the transistor group TR10 of the driver stage are thermally coupled to each other. When a temperature of the transistor group TR10 increases due to self-heating with an increase in the output power Pdout, the temperature of the transistor TR3 also increases. As a result, since an effect of promoting the increase in the collector current Icd occurs, compared to the power amplifier 1000 in which the bias circuit and the driver stage are not thermally coupled to each other, the increase in the collector current Icd with the increase in the output power Pdout increases.

Figure 6:
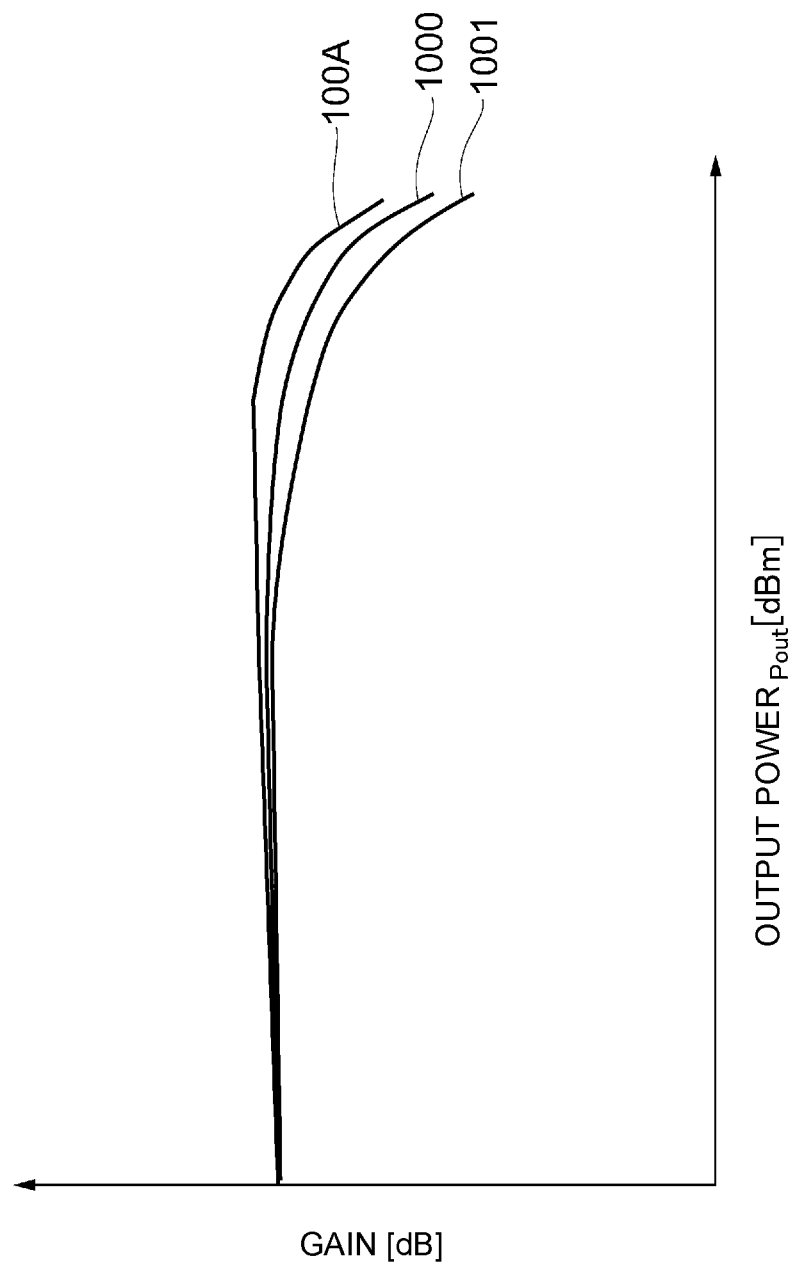
FIG. 6 is a diagram illustrating a relationship between output power Pout (dBm) of a power stage and a gain (dB) in total of a driver stage and the power stage.

FIG. 6 is a diagram illustrating a relationship between the output power Pout (dBm) of the power stage and the gain (dB) in total of the driver stage and the power stage. In FIG. 6, the reference character 100A denotes the power amplifier 100A according to the first embodiment, the reference character 1000 denotes the power amplifier 1000 in which the driver stage and the bias circuit are not thermally coupled, and the reference character 1001 denotes the power amplifier 1001 in which the driver stage and the voltage supply circuit (temperature compensation circuit) of the bias circuit are thermally coupled.

In general, a gain of a transistor increases as a collector current increases, except for a case where an effect of lowering current drivability of the transistor itself due to self-heating becomes remarkable. Thus, as the collector current Icd of the driver stage in FIG. 5 increases, a degree of an increase in the gain in total of the driver stage and the power stage in FIG. 6 increases. Additionally, in the power amplifier 100A, a degree of a decrease in gain at higher output is small, compared to the power amplifiers 1000 and 1001.

Second Embodiment

In a second embodiment, a description of matters common to those of the first embodiment will be omitted, and only different points will be described.

Figure 7:
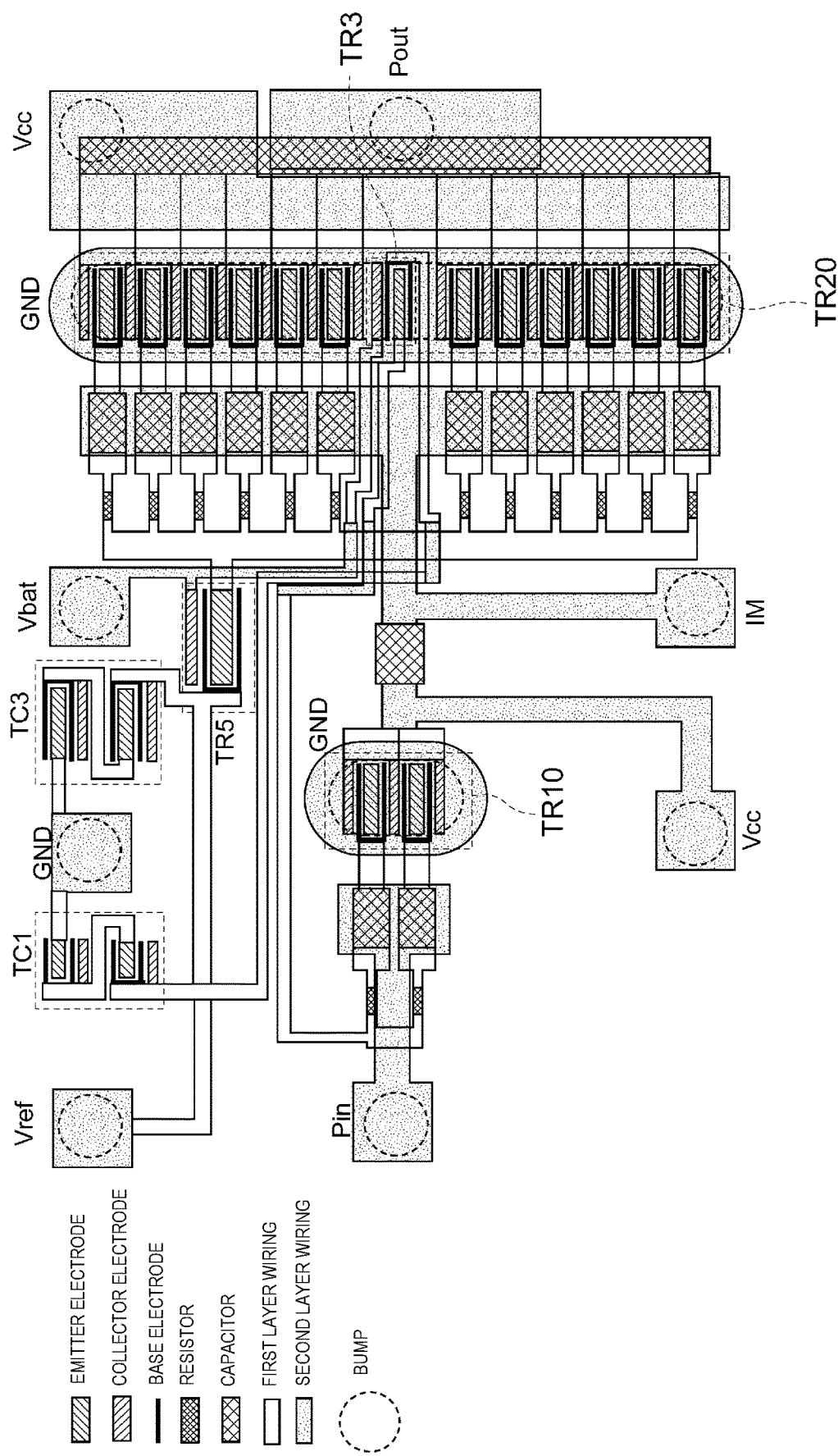
FIG. 7 is a diagram illustrating an example of a layout of a power amplifier according to a second embodiment.
Figure 8:
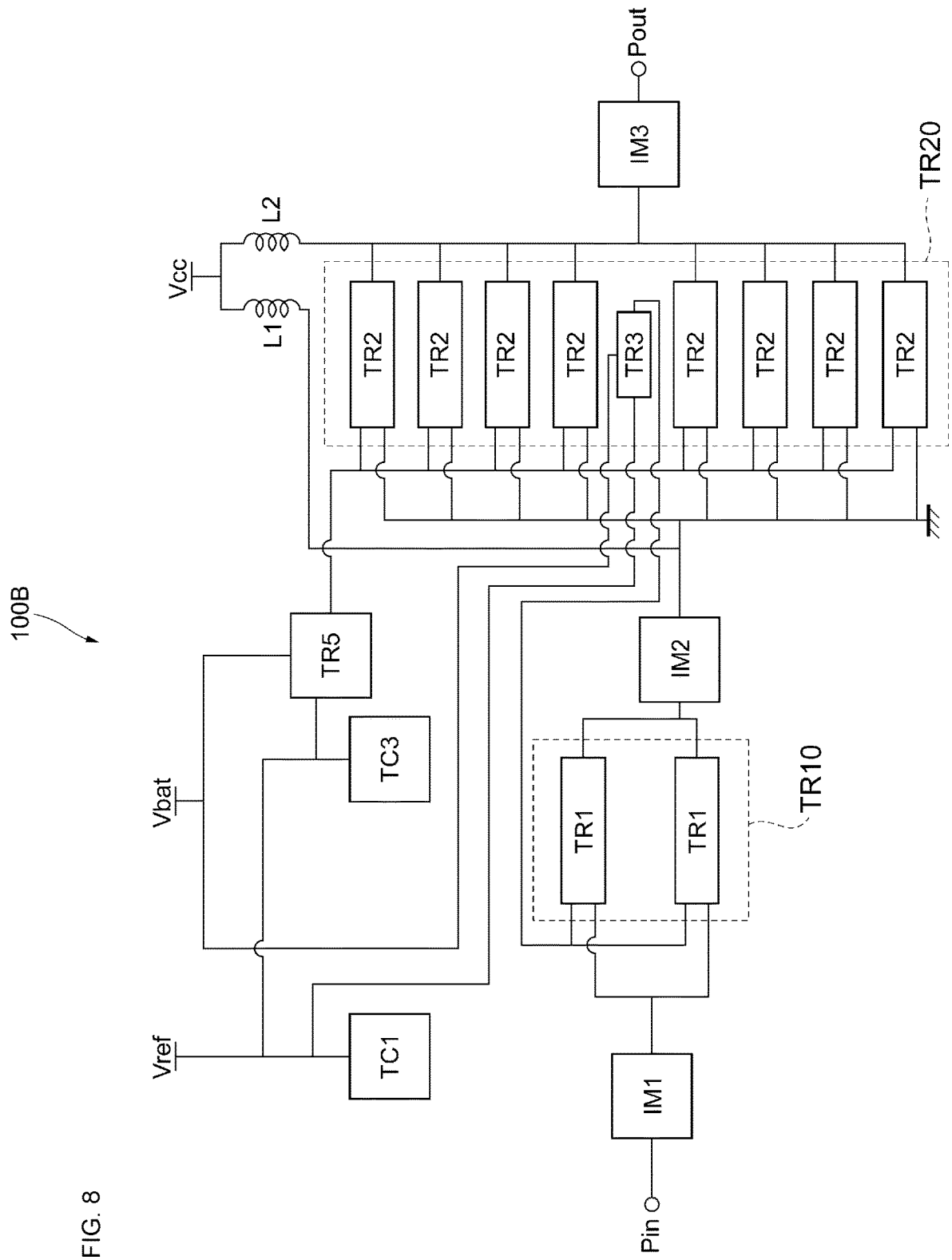
FIG. 8 is a diagram schematically illustrating planar arrangement of each block constituting the power amplifier according to a second embodiment.

FIG. 7 is a diagram illustrating an example of a layout of a power amplifier 100B according to the second embodiment. FIG. 8 is a diagram schematically illustrating planar arrangement of each block constituting the power amplifier 100B according to the second embodiment. Note that, the diagram illustrated in FIG. 7 is a schematic diagram, and does not illustrate an entire configuration of the power amplifier 100B. Further, the diagram illustrated in FIG. 8 is a schematic diagram, and does not accurately illustrate arrangement of the respective units of the power amplifier 100B.

As illustrated in FIGS. 7 and 8, the transistor TR3 and the transistor group TR20 are disposed without other electronic elements interposed therebetween. More specifically, the transistor TR3 is disposed among the transistor group TR20 (in an area sandwiched by the unit transistors TR2 constituting the transistor group TR20 in a plan view). Further, a minimum distance between the transistor TR3 and the transistor group TR20 is smaller than a minimum distance between the voltage supply circuit TC1 and the transistor group TR20.

Figure 9:
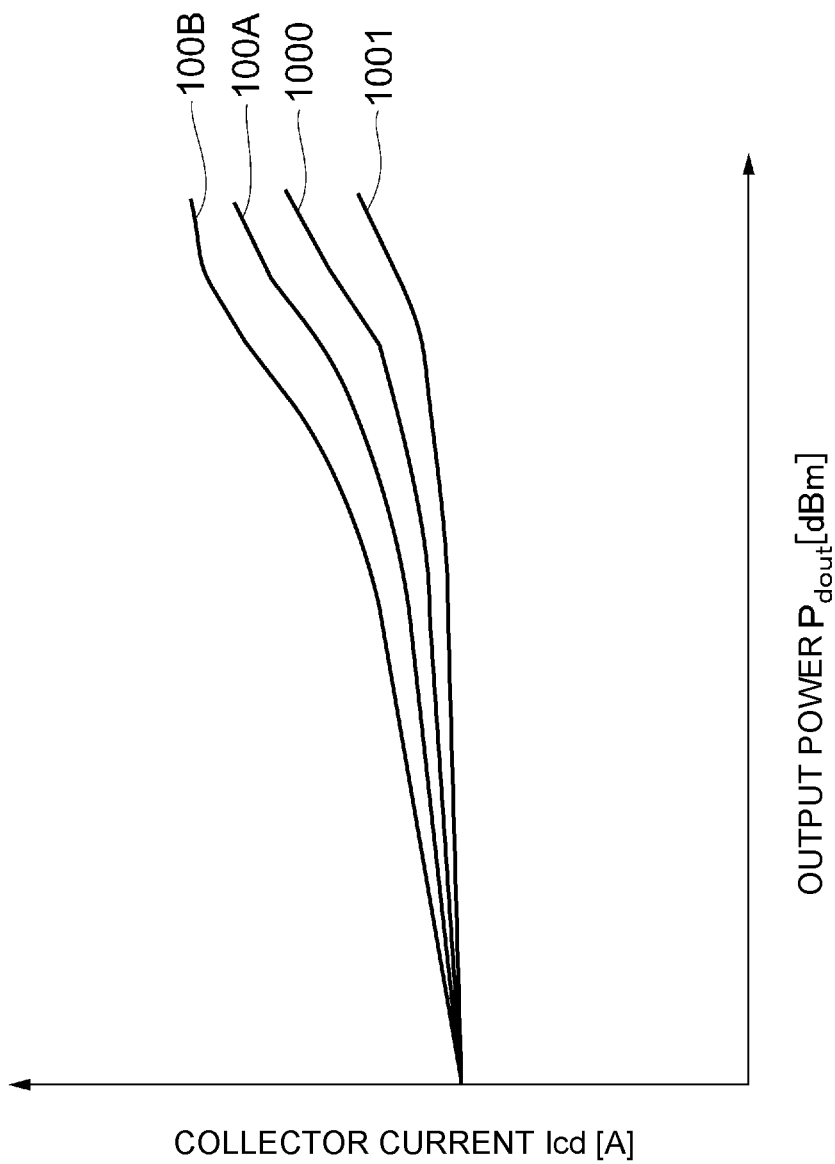
FIG. 9 is a diagram illustrating the relationship between the output power Pdout (dBm) of the driver stage amplifier and the collector current Icd (A)
Figure 10:
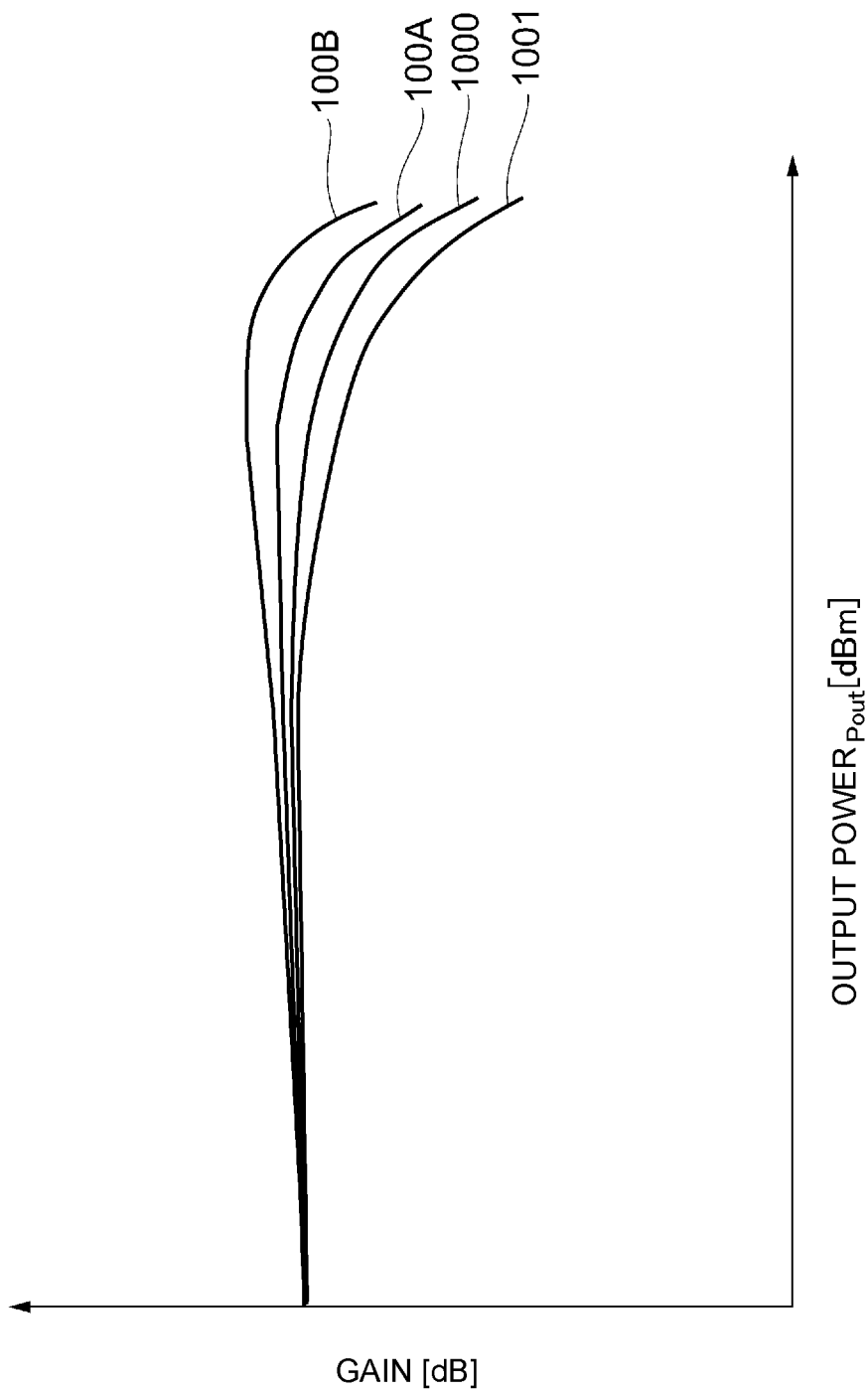
FIG. 10 is a diagram illustrating the relationship between the output power Pout (dBm) of the power stage and the gain (dB) in total of the driver stage and the power stage.

FIG. 9 is a diagram illustrating the relationship between the output power Pdout (dBm) of the driver stage and the collector current Icd (A). FIG. 9 is a diagram obtained by adding the power amplifier 100B according to the second embodiment to the diagram illustrated in FIG. 5. Further, FIG. 10 is a diagram illustrating the relationship between the output power Pout (dBm) of the power stage and the gain (dB) in total of the driver stage and the power stage. FIG. 10 is a diagram obtained by adding the power amplifier 100B according to the second embodiment to the graph illustrated in FIG. 6.

In FIGS. 9 and 10, the reference character 100A denotes the power amplifier 100A according to the first embodiment, the reference character 1000 denotes the power amplifier 1000, the reference character 1001 denotes the power amplifier 1001, and a reference character 100B denotes the power amplifier 100B according to the second embodiment.

As described above, in the power amplifier 100B according to the second embodiment, the emitter-follower circuit transistor TR3 of the driver stage bias circuit and the transistor group TR20 of the power stage are thermally coupled to each other. The temperature increase due to self-heating of the transistor group TR20 with the increase in output is larger than that of the transistor group TR10 of the driver stage. Thus, the temperature increase in the transistor TR3 thermally coupled to the transistor group TR20 is also larger than that in the case of the power amplifier 100A according to the first embodiment. As a result, as illustrated in FIG. 9, the collector current Icd increases greatly, and a degree of the increase in the collector current Icd with the increase in output power Pdout further increases. Further, as illustrated in FIG. 10, a degree of a decrease in gain at high output further decreases.

By thermally coupling the emitter-follower circuit transistor TR5 of the power stage bias circuit to the transistor group TR20 of the power stage, an effect of improving the decrease in gain at high output is obtained. However, the effect is small compared to a case where the emitter-follower circuit transistor TR3 of the driver stage of the power amplifier 100B is thermally coupled to the transistor group TR20 of the power stage. As described above, as factors for increasing the collector current or the gain of the amplifying stage at high output, there are two factors, that is, a temperature increase in an amplifying stage transistor and the emitter-follower transistor due to self-heating, and an increase in bias voltage due to expansion in voltage amplitude of an RF signal, and the like. In the driver stage, the two factors are both small, and both are large in the power stage. The two factors cancel each other out. That is, when the gain increases due to the increase in the bias voltage caused by the voltage amplitude expansion, even when there is a temperature increase due to self-heating, a further increase in gain thereby is small. Thus, even when the emitter-follower circuit transistor of the power stage is thermally coupled to the power stage, an increase in gain thereby is small. As in the case of the power amplifier 100B, the gain can be increased most effectively by thermally coupling the transistor of the emitter-follower circuit of the driver stage in which the increase in the bias voltage due to the voltage amplitude expansion of the RF signal is small to the power stage in which the temperature increase due to self-heating is large.

Third Embodiment

In a third embodiment, a description of matters common to those of the first embodiment will be omitted, and only different points will be described.

Figure 11:
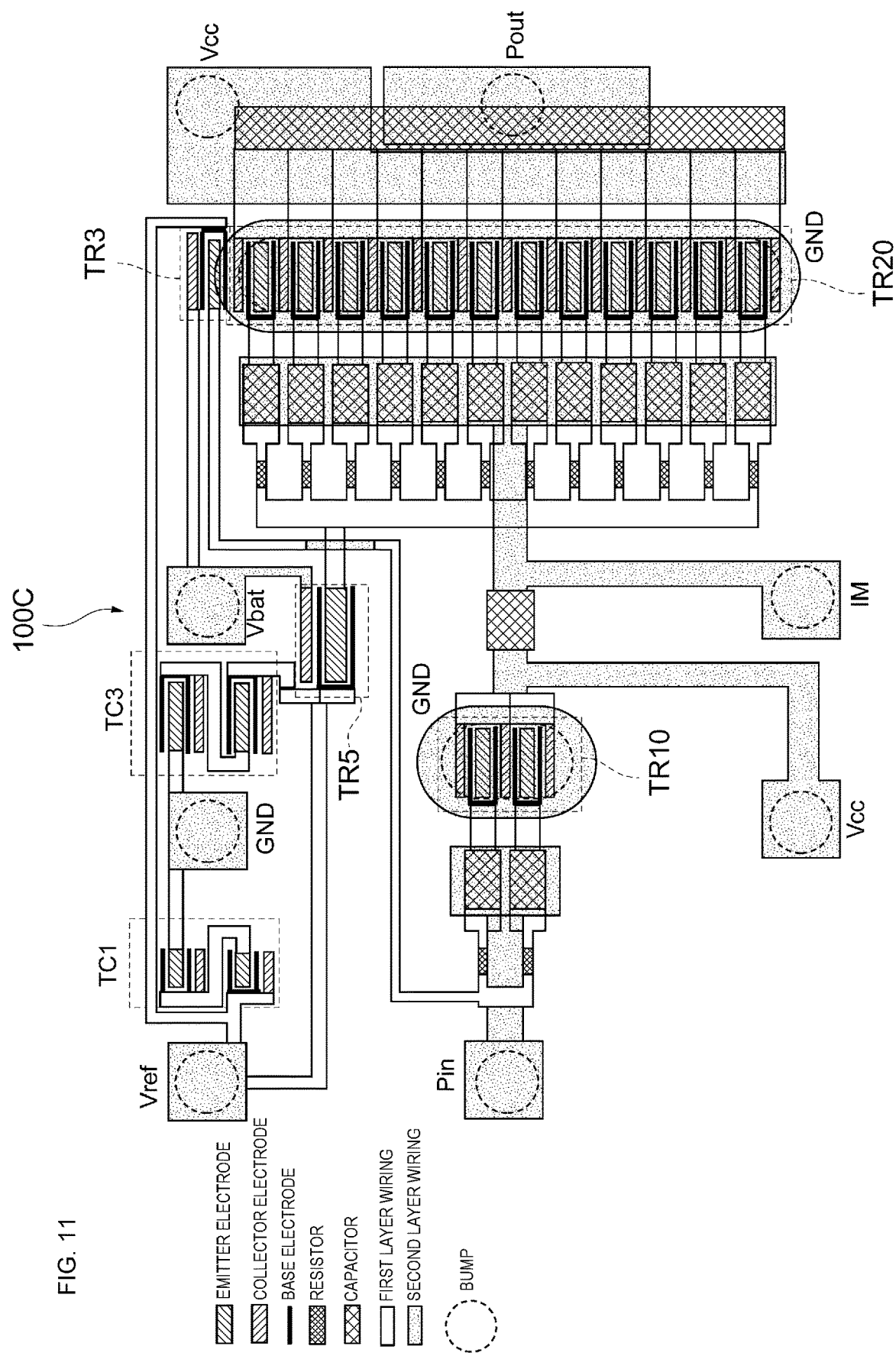
FIG. 11 is a diagram illustrating an example of a layout of a power amplifier according to a third embodiment.
Figure 12:
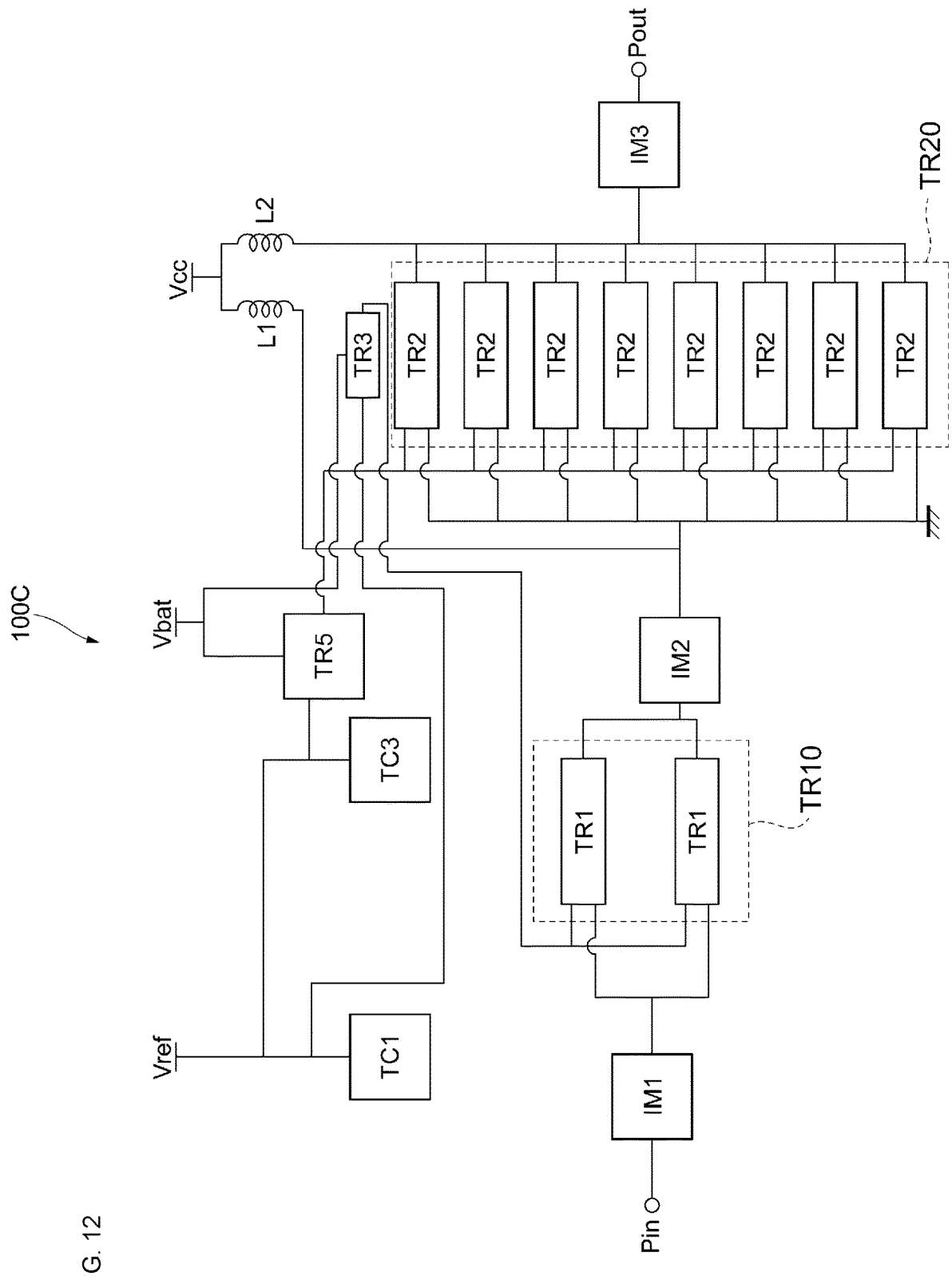
FIG. 12 is a diagram schematically illustrating planar arrangement of each block constituting the power amplifier according to the third embodiment.

FIG. 11 is a diagram illustrating an example of a layout of a power amplifier 100C according to the third embodiment. Note that, the diagram illustrated in FIG. 11 is a schematic diagram, and does not illustrate an entire configuration of the power amplifier 100C. Further, FIG. 12 is a diagram schematically illustrating planar arrangement of each block constituting the power amplifier 100C according to the third embodiment. Note that, the diagram illustrated in FIG. 12 is a schematic diagram, and does not accurately illustrate arrangement of the respective units of the power amplifier 100C.

As illustrated in FIGS. 11 and 12, in the power amplifier 100C according to the third embodiment, the transistor TR3 is disposed adjacent to the transistor group TR20 (adjacent to an area in which the plurality of unit transistors TR2 constituting the transistor group TR20 is arranged in a plan view).

Fourth Embodiment

In a fourth embodiment, a description of matters common to those of the first embodiment will be omitted, and only different points will be described.

Figure 13:
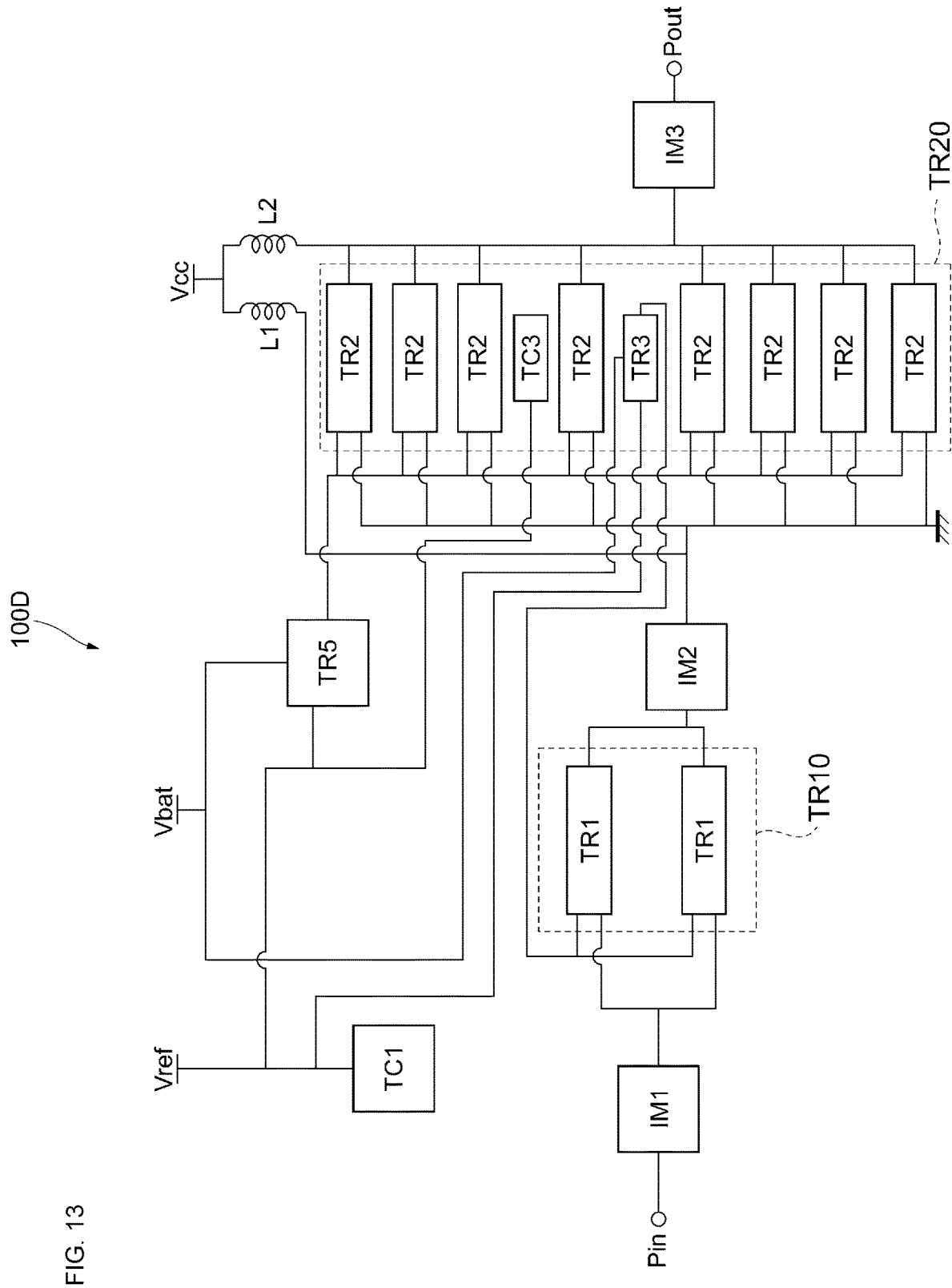
FIG. 13 is a diagram schematically illustrating planar arrangement of each block constituting a power amplifier according to a fourth embodiment.

FIG. 13 is a diagram schematically illustrating planar arrangement of each block constituting a power amplifier 100D according to the fourth embodiment. Note that, the diagram illustrated in FIG. 13 is a schematic diagram, and does not accurately illustrate arrangement of the respective units of the power amplifier 100D.

As illustrated in FIG. 13, the transistor TR3 and the transistor group TR20 are disposed without other electronic elements interposed therebetween. More specifically, the transistor TR3 is disposed among the transistors TR2 (in an area sandwiched by two of the plurality of the unit transistors TR2 constituting the transistor group TR20 in a plan view).

Further, the voltage supply circuit TC3 and the transistor group TR20 are disposed without other electronic elements interposed therebetween. More specifically, the voltage supply circuit TC3 is disposed among the transistor group TR20 (in an area sandwiched by two of the plurality of unit transistors TR2 constituting the transistor group TR20 in a plan view).

When output of the power amplifier 100D increases, a temperature of the transistor group TR20 increases due to self-heating. The heat is transferred to the transistor TR3 and the voltage supply circuit TC3 disposed in a vicinity of the transistor group TR20, and temperatures thereof also increase. As a result of the temperature increase in the transistor TR3, a collector current of the driver stage increases, and a gain thereof also increases. This compensates for a decrease in gain of the power amplifier with an increase in output.

On the other hand, as a result of the temperature increase in the voltage supply circuit TC3, the collector current of the power stage decreases, and the gain thereof decreases. However, as described above, the increase or decrease in gain due to the presence or absence of thermal coupling of the bias circuit to the power stage is smaller than that in the case of the driver stage. Thus, the gain decrease in this case is smaller than the gain increase in the driver stage, and the gain increases as a whole of the power amplifier.

On the other hand, by suppressing the collector current of the power stage due to the temperature increase in the voltage supply circuit TC3, the power stage is prevented from thermally running away and being destroyed. That is, according to the power amplifier 100D according to the fourth embodiment, it is possible to suppress a decrease in gain at high output while preventing destruction due to thermal runaway.

Fifth Embodiment

In a fifth embodiment, a description of matters common to those of the first embodiment will be omitted, and only different points will be described.

Figure 14:
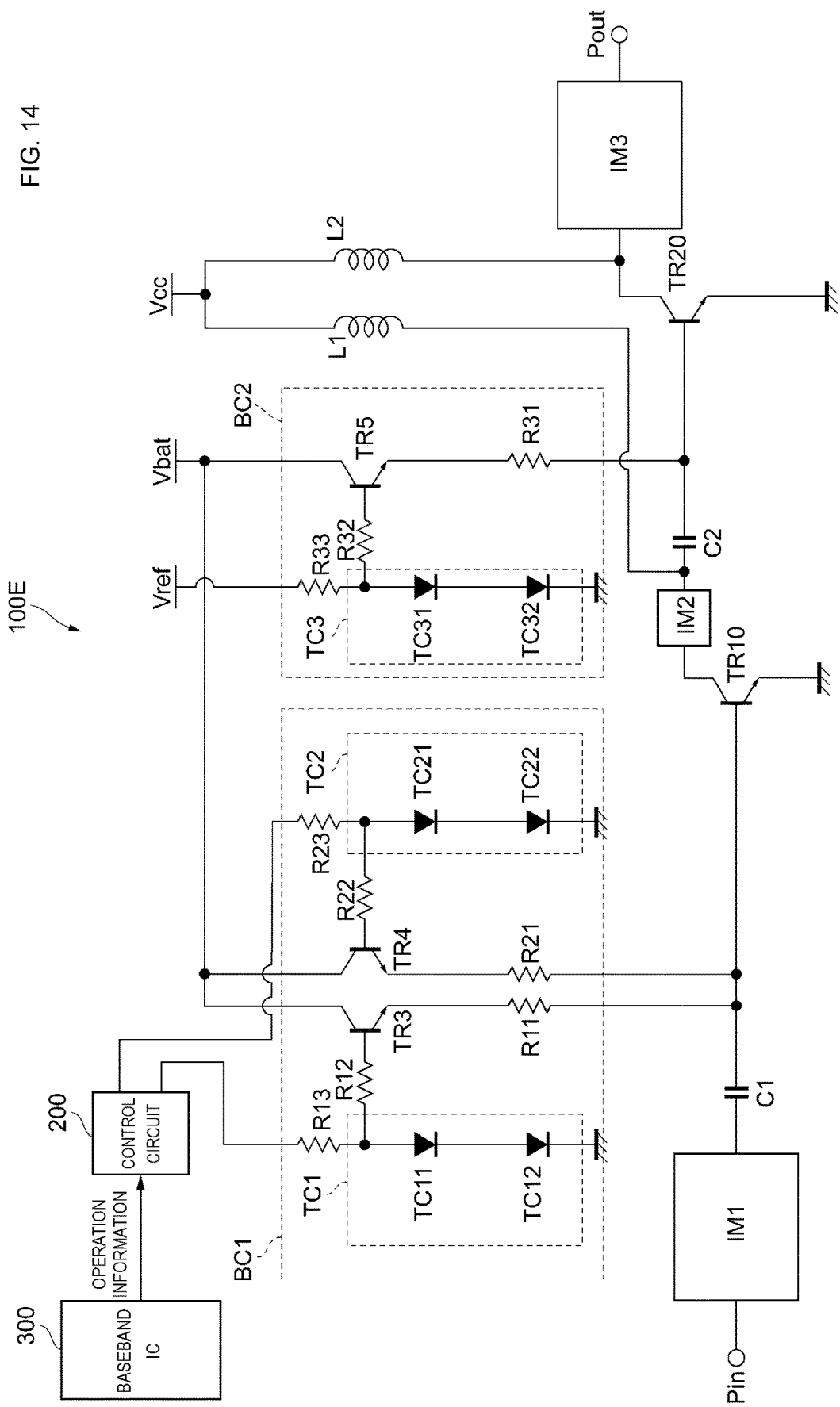
FIG. 14 is a diagram illustrating an outline of a configuration of a power amplifier according to a fifth embodiment.

FIG. 14 is a diagram illustrating an outline of a configuration of a power amplifier 100E according to the fifth embodiment. As illustrated in FIG. 14, the power amplifier 100E further includes a control circuit 200 and a baseband IC 300. Further, as illustrated in FIG. 14, the bias circuit BC1 of the power amplifier 100E includes two systems of supply paths for a bias current to the transistor group TR10. The power amplifier 100E operates, for example, in an Envelope Tracking (ET) mode when output is high, and operates in an Average Power Tracking (APT) mode when output is low.

The bias circuit BC1 further includes, in addition to the configuration included in the power amplifier 100A, a transistor TR4, a voltage supply circuit TC2 (a second voltage supply circuit), and resistance elements R21, R22 and R23. The voltage supply circuit TC2 includes diodes TC21 (a second diode) and TC22 (a second diode).

In the transistor TR4 (a fourth transistor), the voltage Vbat is supplied to a collector, a base is connected to an anode of the diode TC21 via the resistance element R22, and an emitter is connected to the base of the transistor group TR10 via the resistance element R21. The transistor TR4 supplies a bias current to the base of the transistor group TR10 from the emitter.

A cathode of the diode TC21 is connected to an anode of the diode TC22. In the diode TC22, the anode is connected to the cathode of the diode TC21, and a cathode is grounded. Thus, a voltage at a predetermined level (for example, about 2.6 V) is generated at the anode of the diode TC21.

In the resistance element R21, one end is connected to the emitter of the transistor TR4, and another end is connected to the base of the transistor group TR10. In the resistance element R22, one end is connected to the base of the transistor TR4, and another end is connected to the anode of the diode TC21. In the resistance element R23, one end is supplied with a control signal from the control circuit 200, and another end is connected to the anode of the diode TC21.

As illustrated in FIG. 14, in the power amplifier 100E, a control signal is supplied to each of the anode of the diode TC11 via the resistance element R13 and the anode of the diode TC21 via the resistance element R23, from the control circuit 200. The control circuit 200 is supplied with a signal indicative of operation information from the baseband IC 300.

Figure 15:
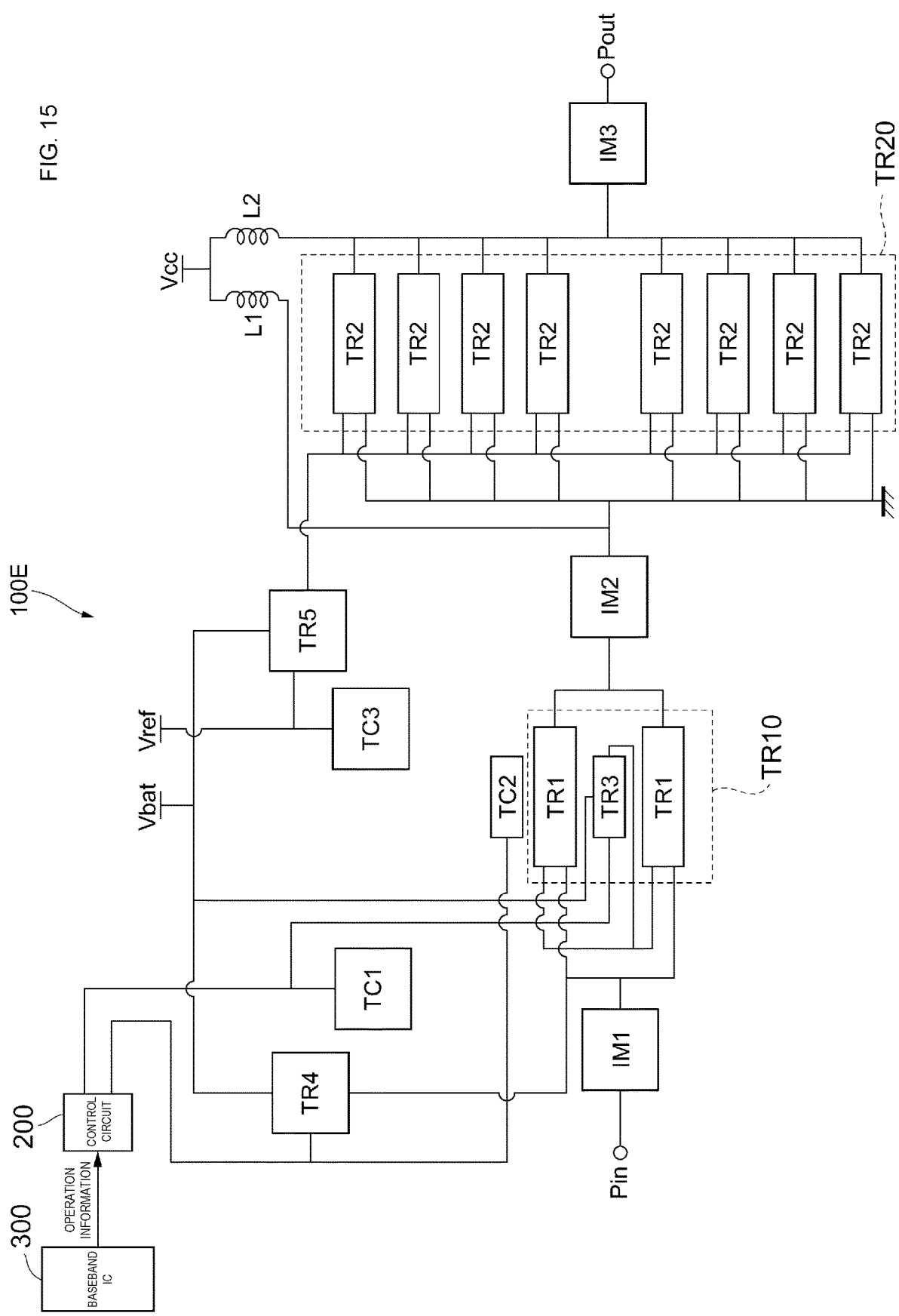
FIG. 15 is a diagram schematically illustrating planar arrangement of each block constituting the power amplifier.

FIG. 15 is a diagram schematically illustrating planar arrangement of each block constituting the power amplifier 100E. Note that, the diagram illustrated in FIG. 15 is a schematic diagram, and does not accurately illustrate arrangement of the respective units of the power amplifier 100E.

As illustrated in FIG. 15, the transistor TR3 is thermally coupled to the transistor group TR10 for a first system, and the voltage supply circuit TC2 is thermally coupled to the transistor group TR10 for a second system. Further, the resistance element R11, that is a ballast resistor in the first system, and the resistance element R21, that is a ballast resistor in the second system, are set to different values, respectively. Terminals corresponding to the bias control voltage Vref of respective emitter-follower circuits are connected to a control circuit, and based on operation mode information from a baseband IC, High potential is supplied to one side, and Low potential is supplied to another side.

When operating in the ET mode, the High potential is supplied to the transistor TR3 to be activated, and the Low potential is supplied to the transistor TR4 to be deactivated. By activating an emitter-follower circuit in the first system in which the transistor TR3 is thermally coupled to the transistor group TR10, the power amplifier 100E has an effect similar to that of the power amplifier 100A according to the first embodiment described above.

On the other hand, when operating in the APT mode, the Low potential is supplied to the transistor TR3 to be deactivated, and the High potential is supplied to the transistor TR4 to be activated. By activating an emitter-follower circuit in the second system in which the voltage supply circuit TC2 is thermally coupled to the transistor group TR10, an increase in bias current flowing to a driver stage is suppressed when a temperature of a transistor in an amplifying stage increases due to an increase in ambient temperature or self-heating, and the effect similar to that of the prior art in which change in performance of an power amplifier due to temperature change is suppressed is achieved. That is, by switching emitter-follower circuits to be activated in accordance with the operation modes, effects required in the respective modes can be obtained. The thermal coupling of the voltage supply circuit TC2 to the driver stage is not always necessary, depending on a way of designing output to which the APT mode is applied, or a type of a circuit of the voltage supply circuit TC2.

The number of the systems of the emitter-follower circuits is not limited to about two, and may be about three or more. A configuration may be adopted in which a resistance value of a ballast resistor is different for each system. Also, systems that are not thermally coupled to the amplifying stage may be included. These are used to divide operation modes and output modes of a power amplifier more finely, and are optimally designed for the respective modes.

Sixth Embodiment

In a sixth embodiment, a description of matters common to those of the first embodiment will be omitted, and only different points will be described.

Figure 16:
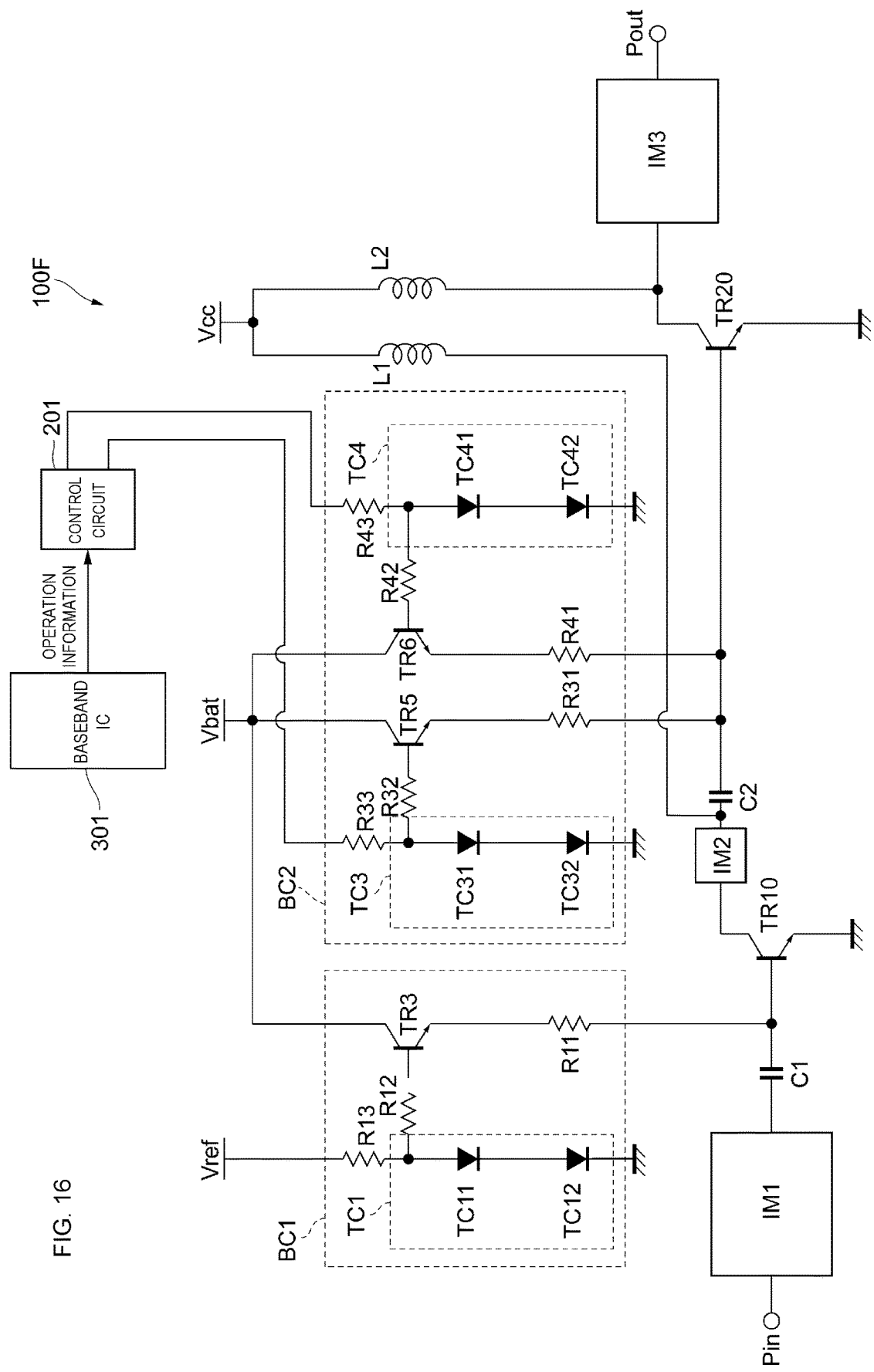
FIG. 16 is a diagram illustrating an outline of a configuration of a power amplifier according to a sixth embodiment.

FIG. 16 is a diagram illustrating an outline of a configuration of a power amplifier 100F according to the sixth embodiment. As illustrated in FIG. 16, the power amplifier 100F further includes a control circuit 201 and a baseband IC 301. Further, as illustrated in FIG. 16, the bias circuit BC2 of the power amplifier 100F includes two systems of supply paths for a bias current to the transistor group TR20. The power amplifier 100F operates, for example, in an Envelope Tracking (ET) mode when output is high, and operates in an Average Power Tracking (APT) mode when output is low.

The bias circuit BC2 further includes, in addition to the configuration included in the power amplifier 100A, a transistor TR6, a voltage supply circuit TC4 (a fourth voltage supply circuit), and resistance elements R41, R42 and R43. The voltage supply circuit TC4 includes diodes TC41 (a fourth diode) and TC42 (a fourth diode).

In the transistor TR6 (a sixth transistor), the voltage Vbat is supplied to a collector, a base is connected to the anode of the diode TC41 via the resistance element R42, and an emitter is connected to the base of the transistor group TR20 via the resistance element R41. The transistor TR6 supplies a bias current to the base of the transistor group TR20 from the emitter.

A cathode of the diode TC41 is connected to an anode of the diode TC42. In the diode TC42, the anode is connected to the cathode of the diode TC41, and a cathode is grounded. Thus, a voltage at a predetermined level (for example, about 2.6 V) is generated at the anode of the diode TC41.

In the resistance element R41, one end is connected to the emitter of the transistor TR6, and another end is connected to the base of the transistor group TR20. In the resistance element R42, one end is connected to the base of the transistor TR6, and another end is connected to the anode of the diode TC41. In the resistance element R43, one end is supplied with a control signal from the control circuit 201, and another end is connected to the anode of the diode TC41.

As illustrated in FIG. 16, in the power amplifier 100F, a control signal is supplied to each of the anode of the diode TC31 via the resistance element R33 and the anode of the diode TC41 via the resistance element R43, from the control circuit 201. The control circuit 201 is supplied with a signal indicative of operation information from the baseband IC 301.

Figure 17:
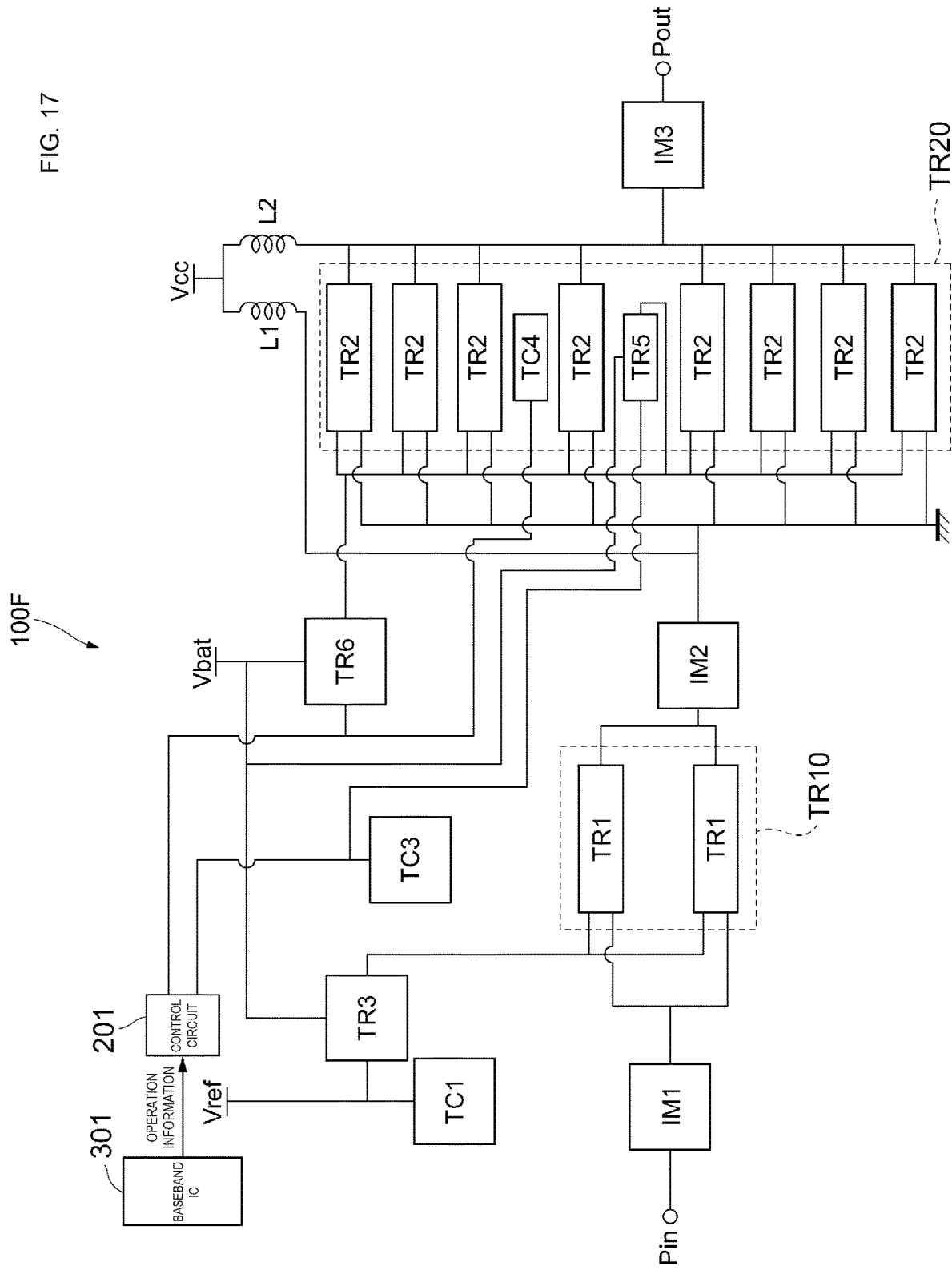
FIG. 17 is a diagram schematically illustrating planar arrangement of each block constituting the power amplifier.

FIG. 17 is a diagram schematically illustrating planar arrangement of each block constituting the power amplifier 100F. Note that, the diagram illustrated in FIG. 17 is a schematic diagram, and does not accurately illustrate arrangement of the respective units of the power amplifier 100F.

As illustrated in FIG. 17, the transistor TR5 is thermally coupled to the transistor group TR20 for a first system, and the voltage supply circuit TC4 is thermally coupled to the transistor group TR20 for a second system. Further, the resistance element R31, that is a ballast resistor in the first system, and the resistance element R41, that is a ballast resistor in the second system, are set to different values, respectively. Terminals corresponding to the bias control voltage Vref of respective emitter-follower circuits are connected to a control circuit, and based on operation mode information from a baseband IC, High potential is supplied to one side, and Low potential is supplied to another side.

When operating in the ET mode, the High potential is supplied to the transistor TR5 to be activated, and the Low potential is supplied to the transistor TR6 to be deactivated. By activating an emitter-follower circuit in the first system in which the transistor TR5 is thermally coupled to the transistor group TR20, the power amplifier 100F has an effect similar to that of the power amplifier 100A according to the first embodiment described above.

On the other hand, when operating in the APT mode, the Low potential is supplied to the transistor TR5 to be deactivated, and the High potential is supplied to the transistor TR6 to be activated. By activating an emitter-follower circuit in the second system in which the voltage supply circuit TC4 is thermally coupled to the transistor group TR20, an increase in bias current flowing to a power stage is suppressed when a temperature of a transistor in an amplifying stage increases due to an increase in ambient temperature or self-heating, and the effect similar to that of the prior art in which change in performance of an power amplifier due to temperature change is suppressed is achieved. That is, by switching emitter-follower circuits to be activated in accordance with the operation modes, effects required in the respective modes can be obtained. The thermal coupling of the voltage supply circuit TC4 to the power stage is not always necessary, depending on a way of designing output to which the APT mode is applied, or a type of a circuit of the voltage supply circuit TC4.

The number of the systems of the emitter-follower circuits is not limited to about two, and may be about three or more. A configuration may be adopted in which a resistance value of a ballast resistor is different for each system. Also, systems that are not thermally coupled to the amplifying stage may be included. These are used to divide operation modes and output modes of a power amplifier more finely, and are optimally designed for the respective modes.

Seventh Embodiment

In a seventh embodiment, a description of matters common to those of the fifth embodiment will be omitted, and only different points will be described.

A circuit configuration of a power amplifier 100G according to the seventh embodiment is similar to the circuit configuration of the power amplifier 100E according to the fifth embodiment described with reference to FIG. 14.

Figure 18:
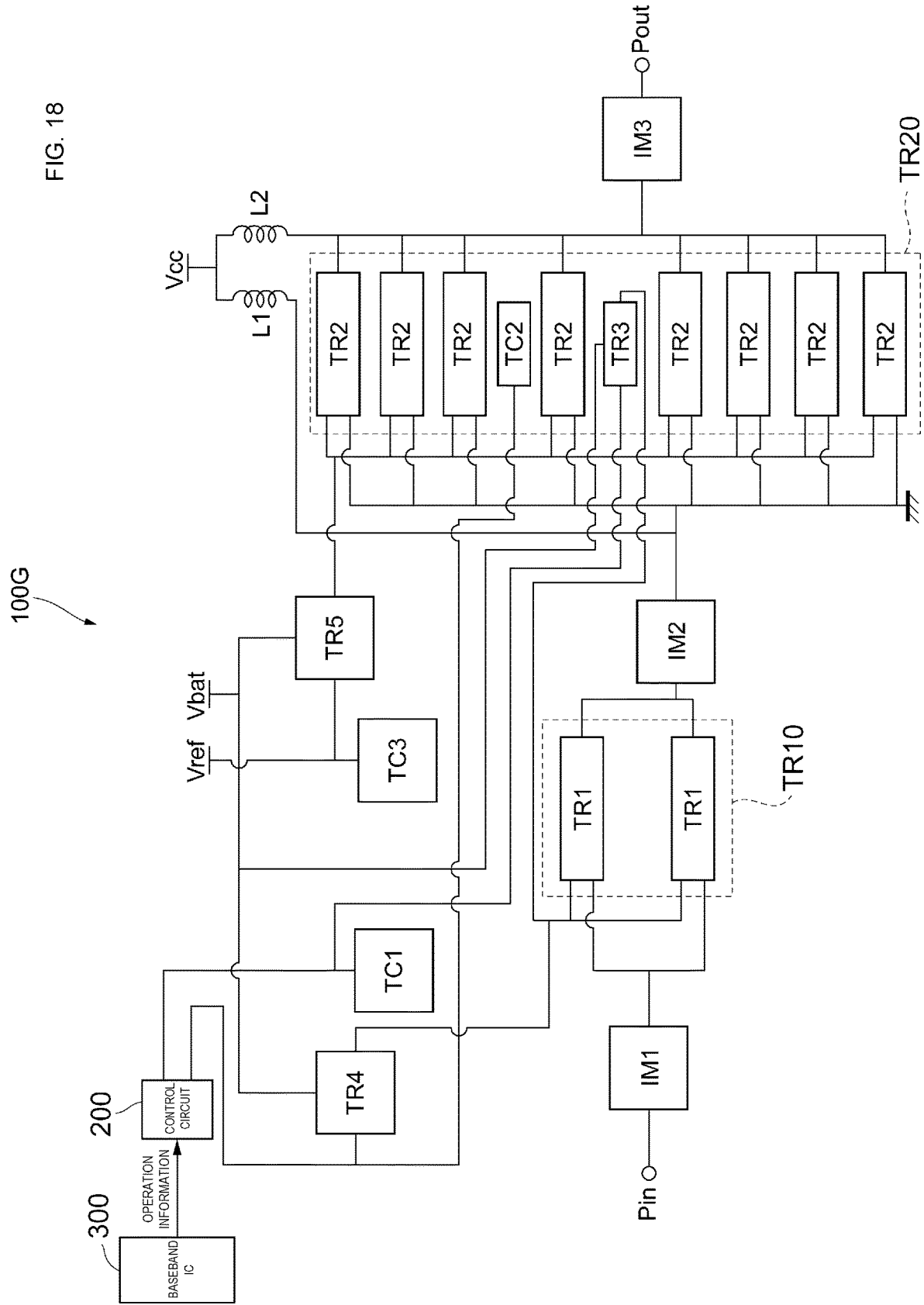
FIG. 18 is a diagram schematically illustrating planar arrangement of each block constituting a power amplifier.

FIG. 18 is a diagram schematically illustrating planar arrangement of each block constituting the power amplifier 100G Note that, the diagram illustrated in FIG. 18 is a schematic diagram, and does not accurately illustrate arrangement of the respective units of the power amplifier 100G.

As illustrated in FIG. 18, the transistor TR3 is thermally coupled to the transistor group TR20 for a first system, and the voltage supply circuit TC2 is thermally coupled to the transistor group TR20 for a second system.

When output of the power amplifier increases, a temperature increase due to self-heating is larger in the power stage than that in the driver stage. As a result, for the reasons described with reference to FIGS. 5 and 6, the seventh embodiment is similar to the third embodiment, but has a more remarkable effect. The thermal coupling of the voltage supply circuit TC2 to the power stage is not always necessary, depending on a way of designing output to which the APT mode is applied, or a type of the voltage supply circuit TC2.

The number of the systems of the emitter-follower circuits is not limited to about two, and may be about three or more. A configuration may be adopted in which a resistance value of a ballast resistor is different for each system. Also, systems that are not thermally coupled to the amplifying stage may be included. These are used to divide operation modes and output modes of a power amplifier more finely, and are optimally designed for the respective modes.

Figure 20A:
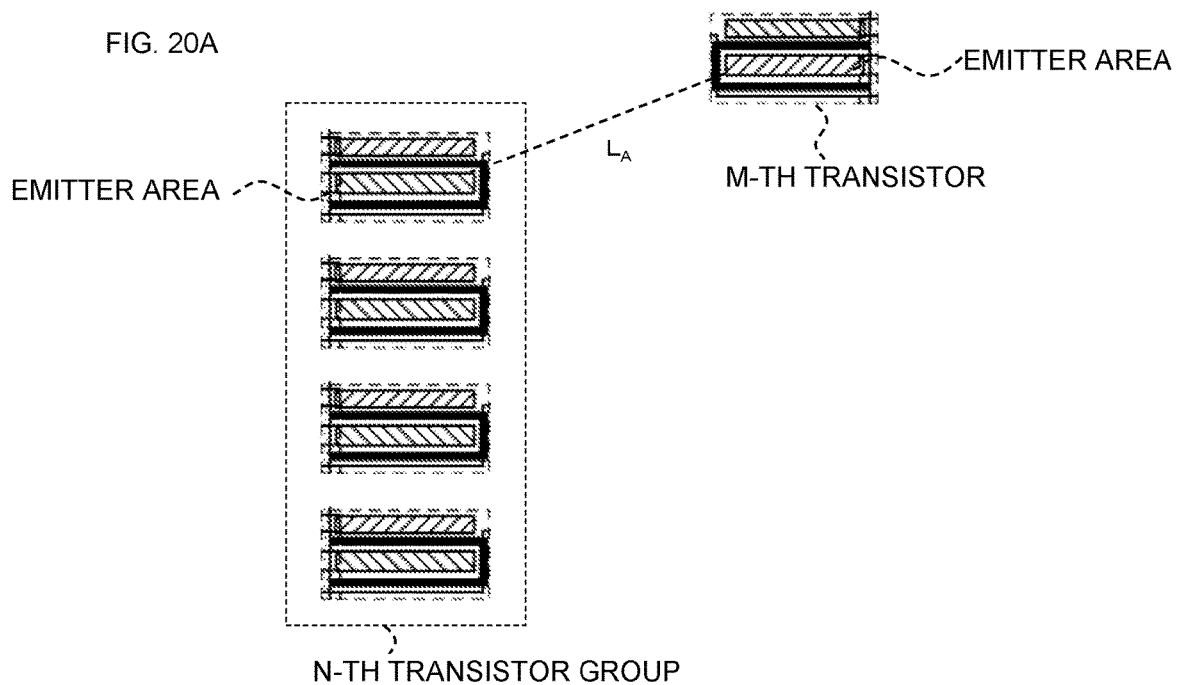
FIG. 20A is a diagram illustrating an exemplification of a minimum distance between an M-th transistor and an N-th transistor group.

In the above embodiments, a minimum distance between an M-th transistor and an N-th transistor group indicates a shortest distance between an emitter area of one transistor closest to the M-th transistor in an area constituting the N-th transistor group, and an emitter area of the M-th transistor in a plan view. This shortest distance is represented by a dotted line $L_A$ in FIG. 20A. Note that, the M-th transistor is, for example, the third transistor, the fourth transistor, the fifth transistor, or a twenty-first transistor, and the N-th transistor group is, for example, the first transistor group or the second transistor group.

Figure 20B:
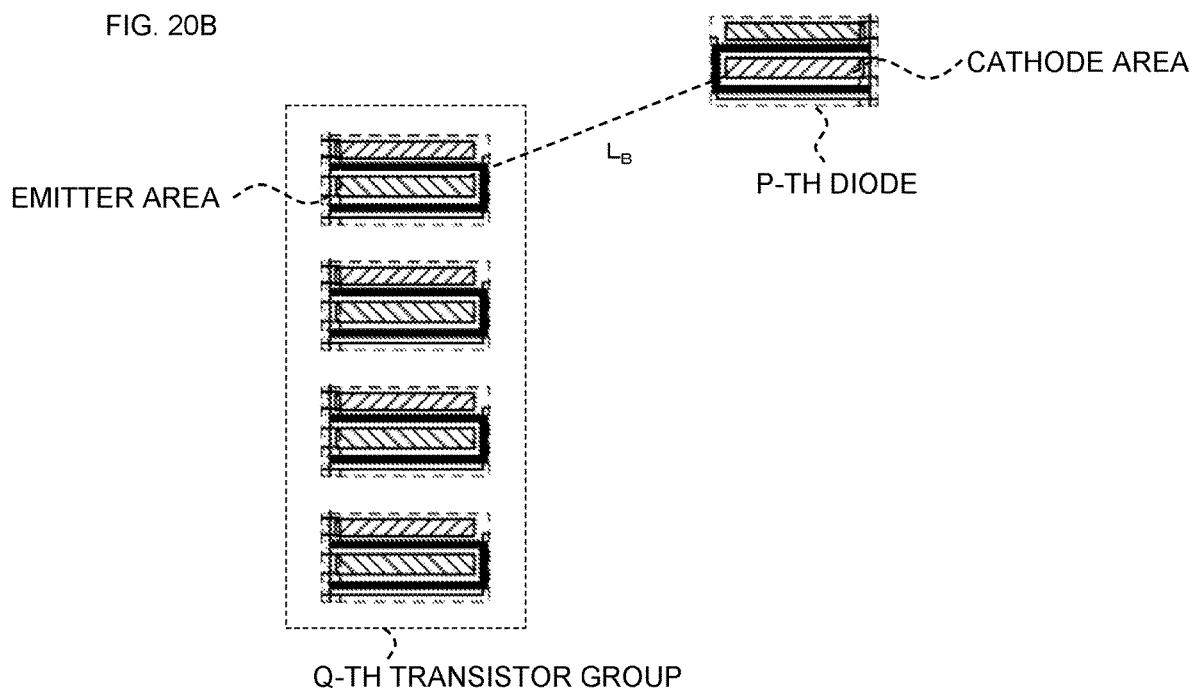
FIG. 20B is a diagram illustrating an exemplification of a minimum distance between a P-th diode and a Q-th transistor group.

Further, a minimum distance between a P-th diode and a Q-th transistor group indicates a shortest distance between an emitter area of one transistor closest to the P-th diode in an area constituting the Q-th transistor group and a cathode area of the P-th diode in a plan view. This shortest distance is represented by a dotted line $L_B$ in FIG. 20B. Note that, the P-th diode is, for example, the second diode, and the Q-th transistor group is, for example, the first transistor group, or the second transistor group.

Further, a minimum distance between an X-th voltage supply circuit and a Y-th transistor group indicates a shortest distance between a cathode area of one diode closest to the Y-th transistor group in an area constituting the X-th voltage supply circuit and an emitter area of one transistor closest to the voltage supply circuit in an area constituting the Y-th transistor group, in a plan view. This shortest distance is represented by a dotted line $L_C$ in FIG. 20C. Note that, the X-th voltage supply circuit is, for example, the first voltage supply circuit or the third voltage supply circuit, and the Y-th transistor group is, for example, the first transistor group or the second transistor group.

The various embodiments of the present disclosure have been described above. A power amplifier according to an aspect of the present disclosure includes a first transistor group including a plurality of unit transistors connected in parallel for amplifying and outputting a radio frequency signal, a second transistor group including a plurality of unit transistors connected in parallel for amplifying and outputting an output signal from the first transistor group, a third transistor for supplying a bias current to a base of the first transistor group, and a first voltage supply circuit including at least one of a first diode and an eleventh transistor, for supplying a lower voltage to a base of the third transistor as a temperature of the first diode or the eleventh transistor is higher, in which the third transistor and the first transistor group are disposed without another electronic element interposed therebetween or the third transistor and the second transistor group are disposed without another electronic element interposed therebetween, and the third transistor is disposed such that a minimum distance between the third transistor and the first transistor group is smaller than a minimum distance between the first voltage supply circuit and the first transistor group, or a minimum distance between the third transistor and the second transistor group is smaller than a minimum distance between the first voltage supply circuit and the second transistor group.

Accordingly, the third transistor can be thermally coupled to the first transistor group or the second transistor group of the amplifying stage strongly compared to the first voltage supply circuit, so that it is possible to reduce a decrease in gain with an increase in output.

Further, in the power amplifier described above, the third transistor may be disposed adjacent to the first transistor group or the second transistor group.

Accordingly, the third transistor can be thermally coupled to the first transistor group or the second transistor group of the amplifying stage effectively and strongly compared to the first voltage supply circuit, and a decrease in gain with an increase in output can be reduced.

Additionally, in the power amplifier described above, the third transistor may be disposed between two of the plurality of unit transistors constituting the first transistor group or between two of the plurality of unit transistors constituting the second transistor group.

Accordingly, the third transistor can be thermally coupled to the first transistor group or the second transistor group of the amplifying stage effectively and strongly compared to the first voltage supply circuit, and a decrease in gain with an increase in output can be reduced.

Further, in the power amplifier described above, a fourth transistor for supplying a bias current to the base of the first transistor group, and a second voltage supply circuit including at least one of a second diode and a twenty-first transistor, for supplying a lower voltage to a base of the fourth transistor as a temperature of the second diode or the twenty-first transistor is higher are further included, and only one of the third transistor and the fourth transistor selectively supplies a bias current to the base of the first transistor group in accordance with an operation mode of the power amplifier.

Accordingly, the bias current suitable for the operation mode of the power amplifier can be supplied to a transistor (first transistor group) of a driver stage.

Further, in the power amplifier described above, at least one of the second diode and the twenty-first transistor, and the first transistor group or the second transistor group are disposed without another electronic element interposed therebetween, and at least one of the second diode and the twenty-first transistor is disposed such that a minimum distance between at least one of the second diode and the twenty-first transistor and the first transistor group is smaller than a minimum distance between the fourth transistor and the first transistor group, or a distance between at least one of the second diode and the twenty-first transistor and the second transistor group is smaller than a distance between the fourth transistor and the second transistor group.

Thus, depending on the operation mode of the power amplifier, emitter-follower circuits to be activated can be switched to select a system of thermal coupling suitable for the operation mode.

Additionally, in the power amplifier described above, at least one of the second diode and the twenty-first transistor is disposed adjacent to the first transistor group or the second transistor group.

Thus, depending on the operation mode of the power amplifier, emitter-follower circuits to be activated can be switched to select a system of thermal coupling suitable for the operation mode.

Additionally, in the power amplifier described above, at least one of the second diode and the twenty-first transistor is disposed between two of the plurality of unit transistors constituting the first transistor group or between two of the plurality of unit transistors constituting the second transistor group.

Thus, depending on the operation mode of the power amplifier, emitter-follower circuits to be activated can be switched to select a system of thermal coupling suitable for the operation mode.

Further, a power amplifier according to another aspect of the present disclosure includes a first transistor group for amplifying and outputting a radio frequency signal, a second transistor group for amplifying and outputting an output signal from the first transistor group, a fifth transistor for supplying a bias current to a base of the second transistor group, and a third voltage supply circuit including at least one of a third diode and a thirty-first transistor, for supplying a lower voltage to a base of the fifth transistor as a temperature of the third diode or the thirty-first transistor is higher, in which the fifth transistor and the second transistor group are disposed without another electronic element interposed therebetween, and the fifth transistor is disposed such that a minimum distance between the fifth transistor and the second transistor group is smaller than a minimum distance between the third voltage supply circuit and the second transistor group.

Accordingly, the fifth transistor can be thermally coupled to the second transistor group of a subsequent stage (power stage) among amplifying stages strongly compared to the third voltage supply circuit, and a decrease in gain with an increase in output can be more effectively reduced.

Further, in the power amplifier described above, the fifth transistor may be disposed adjacent to the second transistor group.

This makes it possible to more effectively reduce a decrease in gain caused by the increase in output.

Further, in the power amplifier described above, the fifth transistor may be disposed among a plurality of unit transistors constituting the second transistor group.

This makes it possible to more effectively reduce a decrease in gain caused by the increase in output.

Further, in the power amplifier described above, a sixth transistor for supplying a bias current to the base of the second transistor group, and a fourth voltage supply circuit including at least one of a fourth diode and a forty-first transistor, for supplying a lower voltage to a base of the sixth transistor as a temperature of the fourth diode or the forty-first transistor is higher are further included, and only one of the fifth transistor and the sixth transistor may selectively supply a bias current to the base of the second transistor group in accordance with an operation mode of the power amplifier.

Accordingly, the bias current suitable for the operation mode of the power amplifier can be supplied to a transistor (second transistor group) of a power stage.

Further, in the power amplifier described above, at least one of the fourth diode and the forty-first transistor, and the second transistor group may be disposed without another electronic element interposed therebetween, and at least one of the fourth diode and the forty-first transistor may be disposed such that a minimum distance between at least one of the fourth diode and the forty-first transistor and the second transistor group is smaller than a minimum distance between the sixth transistor and the second transistor group.

Thus, depending on the operation mode of the power amplifier, emitter-follower circuits to be activated can be switched to select a system of thermal coupling suitable for the operation mode.

Additionally, in the power amplifier described above, at least one of the fourth diode and the forty-first transistor may be disposed adjacent to the second transistor group.

Thus, depending on the operation mode of the power amplifier, emitter-follower circuits to be activated can be switched to select a system of thermal coupling suitable for the operation mode.

Further, in the power amplifier described above, at least one of the fourth diode and the forty-first transistor may be disposed between two of the plurality of unit transistors constituting the second transistor group.

Thus, depending on the operation mode of the power amplifier, emitter-follower circuits to be activated can be switched to select a system of thermal coupling suitable for the operation mode.

The embodiments described above are intended to facilitate an understanding of the present disclosure, and are not intended to limit the present disclosure. The elements, the arrangement thereof, the materials, the conditions, the shapes, the sizes, and the like included in the embodiments are not limited to those illustrated, and can be modified as appropriate. Further, it is also possible to partially exchange or combine the structures illustrated in the different embodiments. The phrase "at least one of A, B and C" means "(A), (B), (C), (A and B), (A and C), (B and C) or (A, B and C)".

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A power amplifier, comprising:
a first transistor group including a plurality of unit transistors connected in parallel to amplify and output a radio frequency signal;
a second transistor group including a plurality of unit transistors connected in parallel to amplify and output an output signal from the first transistor group;

a transistor to supply a bias current to a base of the first transistor group; and a first voltage supply circuit including at least one of a first diode and a first diode-connected transistor, to supply a lower voltage to a base of the transistor as a temperature of the first diode or the first diode-connected transistor is higher, wherein the transistor and the first transistor group are disposed without another electronic element interposed therebetween, or the transistor and the second transistor group are disposed without another electronic element interposed therebetween, and the transistor is disposed such that a minimum distance between the transistor and the first transistor group is smaller than a minimum distance between the first voltage supply circuit and the first transistor group, or a minimum distance between the transistor and the second transistor group is smaller than a minimum distance between the first voltage supply circuit and the second transistor group.

2. The power amplifier according to claim 1, wherein the transistor is disposed adjacent to the first transistor group or the second transistor group.

3. The power amplifier according to claim 1, wherein the transistor is disposed among a plurality of unit transistors constituting the first transistor group, or among a plurality of unit transistors constituting the second transistor group.

4. The power amplifier according to claim 1, further comprising:

an other transistor to supply a bias current to the base of the first transistor group; and a second voltage supply circuit including at least one of a second diode and a second diode-connected transistor, to supply a lower voltage to a base of the other transistor as a temperature of the second diode or the second diode-connected transistor is higher, wherein only one of the transistor and the other transistor selectively supplies a bias current to the base of the first transistor group in accordance with an operation mode of the power amplifier.

5. The power amplifier according to claim 4, wherein the at least one of the second diode and the second diode-connected transistor and the first transistor group are disposed without another electronic element interposed therebetween or the at least one of the second diode and the second diode-connected transistor and the second transistor group are disposed without another electronic element interposed therebetween, and the at least one of the second diode and the second diode-connected transistor is disposed such that a minimum distance between the at least one of the second diode and the second diode-connected transistor and the first transistor group is smaller than a minimum distance between the other transistor and the first transistor group, or a minimum distance between the at least one of the second diode and the second diode-connected transistor and the second transistor group is smaller than a minimum distance between the other transistor and the second transistor group.

6. The power amplifier according to claim 5, wherein the at least one of the second diode and the second diode-connected transistor is disposed adjacent to the first transistor group or the second transistor group.

7. The power amplifier according to claim 5, wherein the at least one of the second diode and the second diode-connected transistor is disposed among a plurality of unit transistors constituting the first transistor group, or among a plurality of unit transistors constituting the second transistor group.

8. The power amplifier according to claim 2, further comprising:

an other transistor to supply a bias current to the base of the first transistor group; and a second voltage supply circuit including at least one of a second diode and a second diode-connected transistor, to supply a lower voltage to a base of the other transistor as a temperature of the second diode or the second diode-connected transistor is higher, wherein only one of the transistor and the other transistor selectively supplies a bias current to the base of the first transistor group in accordance with an operation mode of the power amplifier.

9. The power amplifier according to claim 3, further comprising:

an other transistor to supply a bias current to the base of the first transistor group; and a second voltage supply circuit including at least one of a second diode and a second diode-connected transistor, to supply a lower voltage to a base of the other transistor as a temperature of the second diode or the second diode-connected transistor is higher, wherein only one of the transistor and the other transistor selectively supplies a bias current to the base of the first transistor group in accordance with an operation mode of the power amplifier.

10. The power amplifier according to claim 8, wherein the at least one of the second diode and the second diode-connected transistor and the first transistor group are disposed without another electronic element interposed therebetween or the at least one of the second diode and the second diode-connected transistor and the second transistor group are disposed without another electronic element interposed therebetween, and the at least one of the second diode and the second diode-connected transistor is disposed such that a minimum distance between the at least one of the second diode and the second diode-connected transistor and the first transistor group is smaller than a minimum distance between the other transistor and the first transistor group, or a minimum distance between the at least one of the second diode and the second diode-connected transistor and the second transistor group is smaller than a minimum distance between the other transistor and the second transistor group.

11. A power amplifier, comprising:

a first transistor group to amplify and output a radio frequency signal;

a second transistor group to amplify and output an output signal from the first transistor group;

a transistor to supply a bias current to a base of the second transistor group; and a first voltage supply circuit including at least one of a first diode and a first diode-connected transistor, to supply a lower voltage to a base of the transistor as a temperature of the first diode or the first diode-connected transistor is higher, wherein the transistor and the second transistor group are disposed without another electronic element interposed therebetween, and the transistor is disposed such that a minimum distance between the transistor and the second transistor group is smaller than a minimum distance between the first voltage supply circuit and the second transistor group.

12. The power amplifier according to claim 11, wherein the transistor is disposed adjacent to the second transistor group.

13. The power amplifier according to claim 11, wherein the transistor is disposed among a plurality of unit transistors constituting the second transistor group.

14. The power amplifier according to claim 11, further comprising:
   an other transistor to supply a bias current to the base of the second transistor group; and
   a second voltage supply circuit including at least one of a second diode and a second diode-connected transistor, to supply a lower voltage to a base of the other transistor as a temperature of the second diode or the second diode-connected transistor is higher,
   wherein only one of the transistor and the other transistor selectively supplies a bias current to the base of the second transistor group in accordance with an operation mode of the power amplifier.

15. The power amplifier according to claim 14,
   wherein the at least one of the second diode and the second diode-connected transistor and the second transistor group are disposed without another electronic element interposed therebetween, and
   a minimum distance between the at least one of the second diode and the second diode-connected transistor and the second transistor group is smaller than a minimum distance between the other transistor and the second transistor group.

16. The power amplifier according to claim 15, wherein the at least one of the second diode and the second diode-connected transistor is disposed adjacent to the second transistor group.

17. The power amplifier according to claim 15, wherein the at least one of the second diode and the second diode-connected transistor is disposed among a plurality of unit transistors constituting the second transistor group.

18. The power amplifier according to claim 12, further comprising:
   an other transistor to supply a bias current to the base of the second transistor group; and
   a second voltage supply circuit including at least one of a second diode and a second diode-connected transistor, to supply a lower voltage to a base of the other transistor as a temperature of the second diode or the second diode-connected transistor is higher,
   wherein only one of the transistor and the other transistor selectively supplies a bias current to the base of the second transistor group in accordance with an operation mode of the power amplifier.

19. The power amplifier according to claim 13, further comprising:
   an other transistor to supply a bias current to the base of the second transistor group; and
   a second voltage supply circuit including at least one of a second diode and a second diode-connected transistor, to supply a lower voltage to a base of the other transistor as a temperature of the second diode or the second diode-connected transistor is higher,
   wherein only one of the transistor and the other transistor selectively supplies a bias current to the base of the second transistor group in accordance with an operation mode of the power amplifier.

20. The power amplifier according to claim 18,
   wherein the at least one of the second diode and the second diode-connected transistor and the second transistor group are disposed without another electronic element interposed therebetween, and
   a minimum distance between the at least one of the second diode and the second diode-connected transistor and the second transistor group is smaller than a minimum distance between the other transistor and the second transistor group.

* * * * *